(12) United States Patent
Wu et al.

(10) Patent No.: US 11,667,575 B2
(45) Date of Patent: Jun. 6, 2023

(54) EROSION RESISTANT METAL OXIDE COATINGS

(71) Applicant: Applied Materials, Inc., Santa Clara, CA (US)

(72) Inventors: Xiaowei Wu, San Jose, CA (US); Jennifer Y. Sun, Mountain View, CA (US); Michael R. Rice, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1116 days.

(21) Appl. No.: 16/039,005

(22) Filed: Jul. 18, 2018

(65) Prior Publication Data

US 2020/0024194 A1 Jan. 23, 2020

(51) Int. Cl.
| | | |
|---|---|---|
| *C04B 35/48* | (2006.01) | |
| *C04B 35/505* | (2006.01) | |
| *C09D 1/00* | (2006.01) | |
| *C23C 16/455* | (2006.01) | |
| *C04B 35/50* | (2006.01) | |
| *C07F 7/00* | (2006.01) | |
| *C07F 5/00* | (2006.01) | |

(52) U.S. Cl.
CPC .............. *C04B 35/48* (2013.01); *C04B 35/50* (2013.01); *C04B 35/505* (2013.01); *C09D 1/00* (2013.01); *C23C 16/45525* (2013.01); *C04B 2235/3225* (2013.01); *C04B 2235/3248* (2013.01); *C07F 5/00* (2013.01); *C07F 7/00* (2013.01)

(58) Field of Classification Search
CPC ........ C04B 35/48; C04B 35/50; C04B 35/505; C04B 2235/3225; C04B 2235/3248; C09D 1/00; C07F 5/00; C07F 7/00
See application file for complete search history.

(56) References Cited

U.S. PATENT DOCUMENTS

| | | |
|---|---|---|
| 5,630,314 A | 5/1997 | Kojima et al. |
| 5,805,973 A | 9/1998 | Coffinberry et al. |
| 5,840,434 A | 11/1998 | Kojima et al. |
| 6,139,983 A | 10/2000 | Ohashi et al. |
| 6,548,424 B2 | 4/2003 | Putkonen |

(Continued)

FOREIGN PATENT DOCUMENTS

| | | | | |
|---|---|---|---|---|
| CN | 105225997 A | | 1/2016 | |
| CN | 106167406 A | * | 11/2016 | ........... C04B 35/495 |

(Continued)

OTHER PUBLICATIONS

CN106167406A machine translation (Year: 2016).*

(Continued)

*Primary Examiner* — Karl E Group
*Assistant Examiner* — Cameron K Miller
(74) *Attorney, Agent, or Firm* — Lowenstein Sandler LLP

(57) ABSTRACT

Embodiments of the present disclosure relate to articles, coated articles and methods of coating such articles with a rare earth metal containing oxide coating. The coating can contain at least a first metal (e.g., a rare earth metal, tantalum, zirconium, etc.) and a second metal that have been co-deposited onto a surface of the article. The coating can include a homogenous mixture of the first metal and the second metal and does not contain mechanical segregation between layers in the coating.

7 Claims, 10 Drawing Sheets

(56) References Cited

U.S. PATENT DOCUMENTS

| | | |
|---|---|---|
| 6,632,549 B1 | 10/2003 | Ohashi et al. |
| 6,641,941 B2 | 11/2003 | Yamada et al. |
| 6,685,991 B2 | 2/2004 | Wataya et al. |
| 6,777,353 B2 | 8/2004 | Putkonen |
| 6,858,332 B2 | 2/2005 | Yamada |
| 6,858,546 B2 | 2/2005 | Niinisto et al. |
| 6,916,534 B2 | 7/2005 | Wataya et al. |
| 7,138,192 B2 | 11/2006 | Yamada et al. |
| 7,351,658 B2 | 4/2008 | Putkonen |
| 7,384,696 B2 | 6/2008 | Hayasaki et al. |
| 7,498,272 B2 | 3/2009 | Niinisto et al. |
| 7,560,376 B2 | 7/2009 | Escher et al. |
| 7,569,280 B2 | 8/2009 | Hayasaki et al. |
| 7,696,117 B2 | 4/2010 | Sun et al. |
| 7,754,621 B2 | 7/2010 | Putkonen |
| 7,780,786 B2 | 8/2010 | Mitsuhashi et al. |
| 7,968,205 B2 | 6/2011 | Nakano et al. |
| 7,998,883 B2 | 8/2011 | Putkonen |
| 8,399,862 B2 | 3/2013 | Ohmi et al. |
| 8,619,406 B2 | 12/2013 | Cho et al. |
| 8,858,745 B2 | 10/2014 | Sun et al. |
| 8,916,021 B2 | 12/2014 | Sun et al. |
| 9,012,030 B2 | 4/2015 | Han et al. |
| 9,090,046 B2 | 7/2015 | Sun et al. |
| 9,343,289 B2 | 5/2016 | Sun et al. |
| 9,394,615 B2 | 7/2016 | Sun et al. |
| 9,440,886 B2 | 9/2016 | Sun et al. |
| 9,551,070 B2 | 1/2017 | Chang et al. |
| 9,617,188 B2 | 4/2017 | Sun et al. |
| 9,617,633 B2 | 4/2017 | He et al. |
| 9,633,884 B2 | 4/2017 | He et al. |
| 2002/0177001 A1 | 11/2002 | Harada et al. |
| 2003/0029563 A1 | 2/2003 | Kaushal et al. |
| 2003/0051811 A1 | 3/2003 | Uchimaru et al. |
| 2004/0002221 A1 | 1/2004 | ODonnell et al. |
| 2004/0009297 A1 | 1/2004 | Fusaro, Jr. et al. |
| 2004/0023811 A1 | 2/2004 | Iijima |
| 2005/0003240 A1 | 1/2005 | O'Donnell |
| 2005/0136188 A1 | 6/2005 | Chang |
| 2005/0227118 A1 | 10/2005 | Uchimaru et al. |
| 2006/0037536 A1 | 2/2006 | Kobayashi et al. |
| 2006/0073354 A1 | 4/2006 | Watanabe et al. |
| 2008/0066647 A1 | 3/2008 | Harada et al. |
| 2008/0213496 A1 | 9/2008 | Sun et al. |
| 2008/0264565 A1 | 10/2008 | Sun et al. |
| 2009/0194233 A1 | 8/2009 | Tamura et al. |
| 2009/0214825 A1 | 8/2009 | Sun et al. |
| 2010/0119843 A1 | 5/2010 | Sun et al. |
| 2010/0119844 A1 | 5/2010 | Sun et al. |
| 2010/0129670 A1 | 5/2010 | Sun et al. |
| 2010/0323124 A1 | 12/2010 | Vartabedian et al. |
| 2011/0091700 A1 | 4/2011 | Simpson |
| 2012/0082849 A1* | 4/2012 | Nonnet ............ C04B 35/119 252/182.33 |
| 2012/0135155 A1 | 5/2012 | Han et al. |
| 2012/0138472 A1 | 6/2012 | Han et al. |
| 2013/0154059 A1 | 6/2013 | Ohmi et al. |
| 2013/0216821 A1 | 8/2013 | Sun et al. |
| 2013/0221445 A1 | 8/2013 | Lei et al. |
| 2014/0116338 A1 | 5/2014 | He et al. |
| 2014/0120312 A1 | 5/2014 | He et al. |
| 2014/0377504 A1* | 12/2014 | Sun ............ C23C 14/22 204/192.1 |
| 2015/0004418 A1 | 1/2015 | Sun et al. |
| 2015/0021324 A1 | 1/2015 | Sun et al. |
| 2015/0024155 A1 | 1/2015 | Sun et al. |
| 2015/0061237 A1 | 3/2015 | Sun et al. |
| 2015/0064450 A1 | 3/2015 | Sun et al. |
| 2015/0152540 A1 | 6/2015 | Sato et al. |
| 2015/0158775 A1 | 6/2015 | Sun et al. |
| 2015/0270108 A1 | 9/2015 | Sun et al. |
| 2015/0299050 A1 | 10/2015 | Sun et al. |
| 2015/0307982 A1 | 10/2015 | Firouzdor et al. |
| 2015/0311043 A1 | 10/2015 | Sun et al. |
| 2015/0311044 A1 | 10/2015 | Sun et al. |
| 2015/0321964 A1 | 11/2015 | Sun et al. |
| 2015/0329955 A1 | 11/2015 | Sun et al. |
| 2016/0079040 A1 | 3/2016 | Park et al. |
| 2016/0181627 A1 | 6/2016 | Roeder et al. |
| 2016/0211121 A1 | 7/2016 | Sun et al. |
| 2016/0273095 A1 | 9/2016 | Lin et al. |
| 2016/0312351 A1 | 10/2016 | Liu et al. |
| 2016/0326625 A1 | 11/2016 | Sun et al. |
| 2016/0326626 A1 | 11/2016 | Sun et al. |
| 2016/0336210 A1 | 11/2016 | Cooke et al. |
| 2016/0375515 A1 | 12/2016 | Xu et al. |
| 2016/0379806 A1 | 12/2016 | Xu et al. |
| 2017/0022595 A1 | 1/2017 | Sato et al. |
| 2017/0110293 A1 | 4/2017 | Sun et al. |
| 2017/0140969 A1 | 5/2017 | Kuo et al. |
| 2017/0314125 A1 | 11/2017 | Fenwick et al. |
| 2018/0044800 A1 | 2/2018 | Hendrix et al. |
| 2019/0062227 A1* | 2/2019 | Kirby ............ C04B 35/71 |

FOREIGN PATENT DOCUMENTS

| | | | |
|---|---|---|---|
| CN | 104081531 A | 6/2017 | |
| CN | 107313027 A | 12/2020 | |
| JP | H03115535 A | 5/1991 | |
| JP | 2006082474 A | 3/2006 | |
| JP | 2007131951 A | 5/2007 | |
| JP | 2007217782 A | 8/2007 | |
| KR | 201 70044396 A | 4/2017 | |
| WO | WO-2007148931 A | * 12/2007 | ......... C23C 16/4404 |
| WO | WO2013032260 A2 | 3/2013 | |
| WO | WO2015120265 A1 | 8/2015 | |

OTHER PUBLICATIONS

Putkonen, M. et al. "Low-Temperature ALE Deposition of Y2O3 Thin Films from β-Diketonate Precursors", Chemical Vapor Deposition, 2001, vol. 7, No. 1, pp. 44-50, Verlag GmbH, Weinheim, Germany.

Pilvi, T. et al. "ALD of YF3 Thin Films from TiF4 and Y(thd)3 Precursors", Chemical Vapor Deposition, 2009, vol. 15, pp. 27-32, Verlag GmbH & Co., Weinheim, Germany.

Lowland, Jason C., "Atomic Layer Deposition of the Al2O3—Y2O3 Pseudo-Binary System," 2010, pp. 1-106, ProQuest LLC.

Johansson, P. et al., "Atomic Layer Deposition Process for Barrier Applications of Flexible Packaging," 2010 Place Conference, Apr. 18-21, 2010, 33 pages, Albequerque, New Mexico.

* cited by examiner

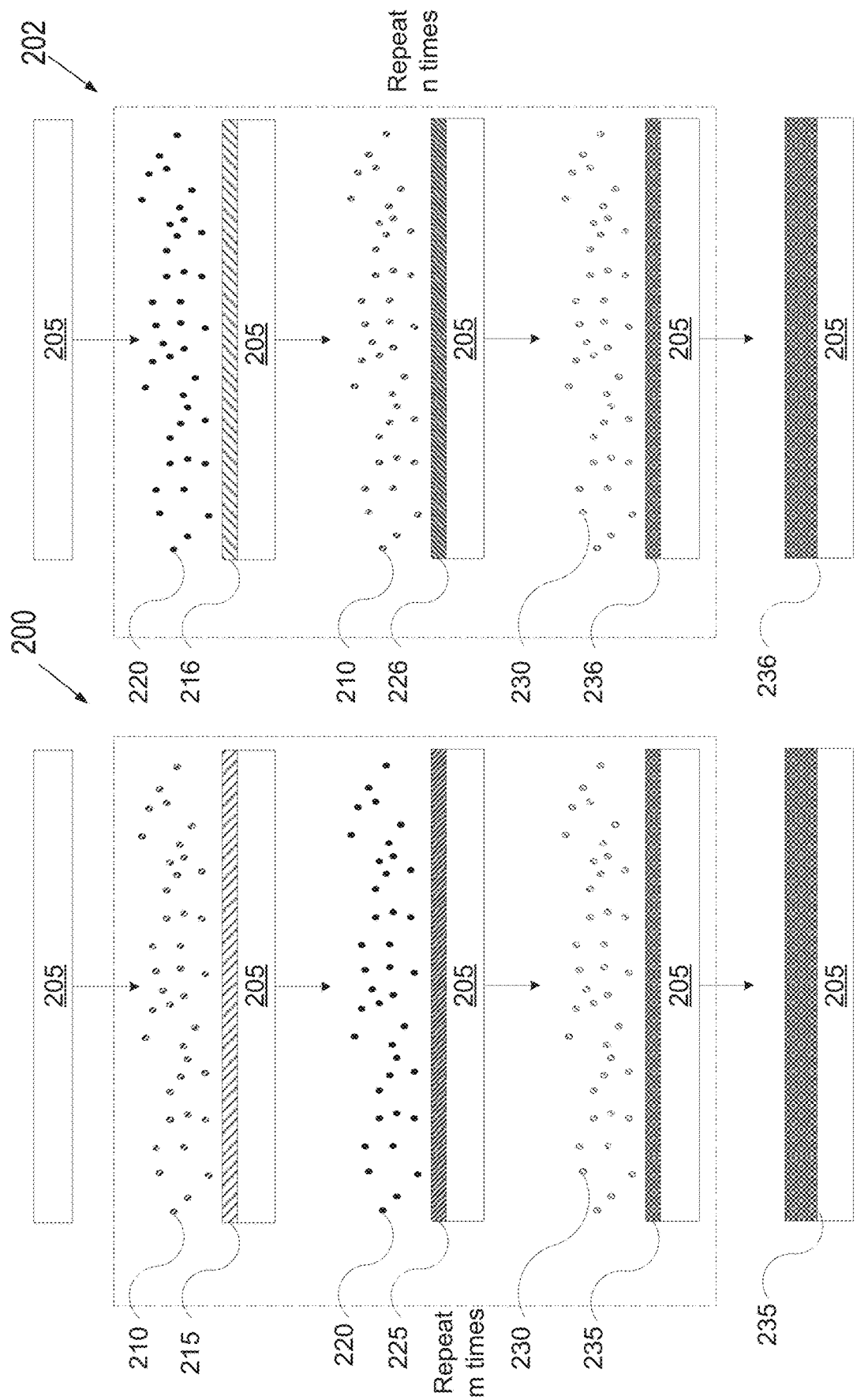

EROSION RESISTANT METAL OXIDE COATINGS

TECHNICAL FIELD

Embodiments of the present disclosure relate to erosion resistant metal oxide coatings, coated articles and methods of forming such coatings using atomic layer deposition.

BACKGROUND

In the semiconductor industry, devices are fabricated by a number of manufacturing processes producing structures of an ever-decreasing size. Some manufacturing processes, such as plasma etch and plasma clean processes, expose a substrate to a high-speed stream of plasma to etch or clean the substrate. The plasma may be highly corrosive, and may corrode processing chambers and other surfaces and components that are exposed to the plasma. This corrosion may generate particles, which frequently contaminate the substrate that is being processed, contributing to device defects. Bromine containing plasmas, which can include bromine ions and radicals, can be particularly harsh resulting in particles generated from interaction of the plasma with materials within the processing chamber. The plasmas can also cause wafer process drift due to changes in the surface chemistry of components induced by radical recombination.

As device geometries shrink, susceptibility to defects increases, and particle contaminant requirements (i.e., on-wafer performance) become more stringent. To minimize particle contamination introduced by plasma etch and/or plasma clean processes, chamber materials have been developed that are resistant to plasmas. Examples of such plasma resistant materials include ceramics composed of $Al_2O_3$, AlN, SiC, $Y_2O_3$, quartz, and $ZrO_2$. Different ceramics provide different material properties, such as plasma resistance, rigidity, flexural strength, thermal shock resistance, and so on. Also, different ceramics have different material costs. Accordingly, some ceramics have superior plasma resistance, other ceramics have lower costs, and still other ceramics have superior flexural strength and/or thermal shock resistance.

Plasma spray coatings formed of $Al_2O_3$, AlN, SiC, $Y_2O_3$, quartz, and $ZrO_2$ can reduce particle generation from chamber components, but such plasma spray coatings are unable to penetrate into and coat high aspect ratio features such as holes of a showerhead. While some deposition techniques are able to coat high aspect ratio features, the resulting coatings may erode and form particles in certain plasma environments, for example, bromine containing plasmas, or suffer from mechanical segregation of layers of materials due to insufficient inter-diffusion in the coatings.

SUMMARY

According to embodiments herein described are articles comprising a body; and a rare earth metal containing oxide coating on a surface of the body, wherein the rare earth metal containing oxide coating comprises about 1 mol % to about 40 mol % of a first metal and about 1 mol % to about 40 mol % of a second metal, wherein the first metal and the second metal are independently selected from a group consisting of a rare earth metal, zirconium, hafnium, aluminum and tantalum, wherein the first metal is different from the second metal, and wherein the rare earth metal containing oxide coating comprises a homogenous mixture of the first metal and the second metal.

Also described in embodiments herein are methods comprising co-depositing a rare earth metal containing oxide coating on a surface of an article using atomic layer deposition, wherein co-depositing the rare earth metal containing oxide coating comprises: contacting the surface with a first precursor for a first duration to form a partial metal adsorption layer comprising a first metal (M1), wherein the first precursor is selected from a group consisting of a rare earth metal containing precursor, a zirconium containing precursor, a hafnium containing precursor, an aluminum containing precursor and a tantalum containing precursor; contacting the partial metal adsorption layer with a second precursor different from the first precursor for a second duration to form a co-adsorption layer comprising the first metal (M1) and the second metal (M2), wherein the second precursor is selected from a group consisting of a rare earth metal containing precursor, a zirconium containing precursor, a hafnium containing precursor, an aluminum containing precursor and a tantalum containing precursor, wherein the first metal is different from the second metal; and contacting the co-adsorption layer with a reactant to form the rare earth metal containing oxide coating, wherein the rare earth metal containing oxide coating comprises about 1 mol % to about 40 mol % of the first metal and about 1 mol % to about 40 mol % of the second metal, and wherein the rare earth metal containing oxide coating comprises a homogenous mixture of the first metal and the second metal.

Also described herein in embodiments are methods comprising: co-depositing a rare earth metal containing oxide coating on a surface of an article using atomic layer deposition, wherein co-depositing the rare earth metal containing oxide coating comprises: performing at least one co-dosing cycle comprising: contacting the surface with a mixture of a first precursor and a second precursor for a first duration to form a co-adsorption layer, wherein the first precursor and the second precursor are each independently selected from a group consisting of a rare earth metal containing precursor, a zirconium containing precursor, a hafnium containing precursor, an aluminum containing precursor and a tantalum containing precursor; and contacting the co-adsorption layer with an oxygen containing reactant to form the rare earth metal containing oxide coating, wherein the rare earth metal containing oxide coating comprises about 1 mol % to about 40 mol % of a first metal and about 1 mol % to about 40 mol % of a second metal, wherein the first metal and the second metal are independently selected from a group consisting of a rare earth metal, zirconium, hafnium, aluminum and tantalum, wherein the first metal is different from the second metal, and wherein the rare earth metal containing oxide coating comprises a homogenous mixture of the rare earth metal and the additional metal.

Further described herein are methods comprising: depositing a rare earth metal containing oxide coating on a surface of an article using atomic layer deposition, wherein depositing the rare earth metal containing oxide coating comprises: contacting the surface with a first precursor for a first duration to form a first metal adsorption layer; contacting the first metal adsorption layer with a reactant to form a first metal layer, contacting the first metal layer with a second precursor for a second duration to form a second metal adsorption layer; contacting the second metal adsorption layer with the reactant to form a second metal layer, forming the rare earth metal containing oxide coating from the first metal layer and the second metal layer, wherein the rare earth metal containing oxide coating comprises about 1 mol % to about 40 mol % of a first metal and about 1 mol % to about 40 mol % of a second metal, wherein the first metal and the second metal are independently selected from a group consisting of a rare earth metal, hafnium and tantalum, wherein the first metal is different from the second metal.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 2A depicts one embodiment of a co-deposition process in accordance with an atomic layer deposition technique as described herein.

FIG. 2B depicts another embodiment of a co-deposition process in accordance with an atomic layer deposition technique as described herein.

DETAILED DESCRIPTION

Figure 1:
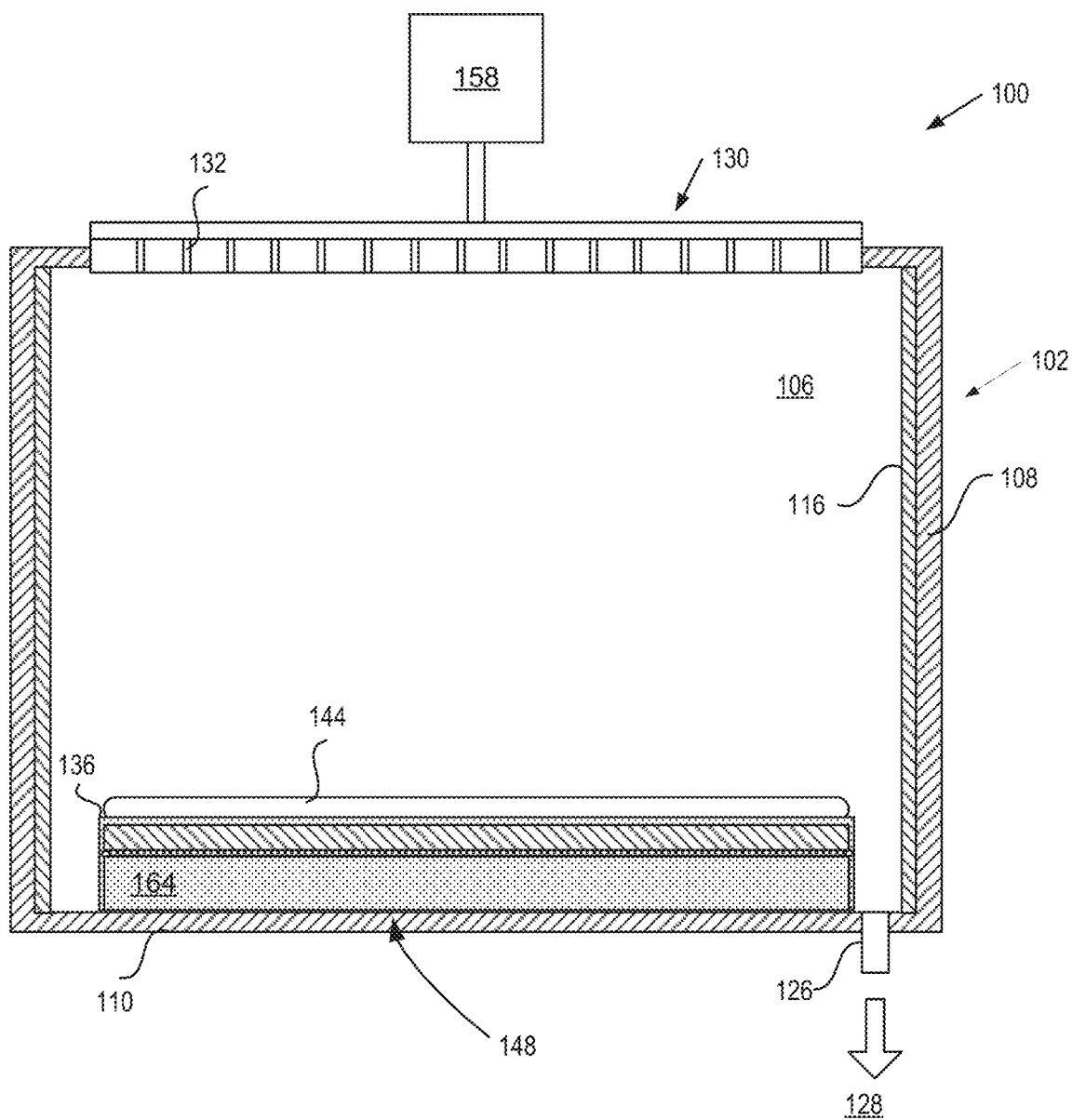
FIG. 1 depicts a sectional view of a processing chamber.

Embodiments described herein relate to complex metal containing oxide coatings that include a mixture of multiple metals. Embodiments also relate to coated articles and methods of forming such complex metal containing oxide coatings using atomic layer deposition. The complex metal containing oxide coatings may include a first metal (M1) and a second metal (M2) where the first metal and the second metal are independently selected from a rare earth metal, zirconium, tantalum, hafnium and aluminum and where the first metal is different from the second metal. In certain embodiments, the rare earth metal containing oxide coating may include more than two metals, for example, M1, M2, M3, M4, etc. each of which is independently selected from a rare earth metal (RE), zirconium, tantalum, hafnium and aluminum. For example, the rare earth metal containing oxide coatings may in the form of $M1_xM2_yO_z$ (e.g., $Y_xZr_yO_z$, $Y_xEr_yO_z$, $Y_xTa_yO_z$, etc.), $M1_wM2_xM3_yO_z$ (e.g., $Y_wEr_xZr_yO_z$, $Y_wZr_xHf_yO_z$, etc.), $M1_vM2_wM3_xM4_yO_z$ (e.g., $Y_vEr_wZr_xHf_yO_z$), and/or more complex metal oxide coatings with a larger number of mixed metals. As will be discussed in more detail below, the multiple different metals (e.g., the first metal, the second metal, etc.) may be co-deposited onto an article using a non-line of sight technique such as atomic layer deposition (ALD). Alternatively, multiple different metal oxides may be sequentially deposited and then interdiffuse to form the complex metal oxide coating. The coatings are resistant to plasma chemistries used for semiconductor processing, for example, bromine containing plasmas having bromine ions and bromine radicals.

According to embodiments described herein, the coatings may be formed of multiple metals (e.g., $RE_wM_yO_z$, $Y_xZr_yO_z$ or $RE_wY_xZr_yO_z$) co-deposited in a single adsorption layer. In some embodiments, at least one of the metals is a rare earth metal. The at least one rare earth metal may be selected from yttrium, erbium, lanthanum, lutetium, scandium, gadolinium, samarium or dysprosium. In certain embodiments, the coatings may be formed of tantalum and at least one additional metal. The at least one additional metal may be selected from a rare earth metal (RE), zirconium (Zr), aluminum (Al), hafnium (Hf), silicon (Si) and hafnium (Hf) in embodiments. According to embodiments, the complex metal containing oxide coating can contain about 1 mol % to about 40 mol %, or about 5 mol % to about 30 mol %, or about 10 mol % to about 25 mol %, or about 15 mol % to about 20 mol % of a first metal (e.g., a rare earth metal, tantalum, etc.) and about 1 mol % to about 40 mol %, or about 5 mol % to about 30 mol %, or about 10 mol % to about 20 mol % of a second metal (e.g., a rare earth metal, tantalum, aluminum, hafnium, silicon, etc.).

In certain embodiments, the coatings may be formed of at least one rare earth metal (e.g., as the first metal) and at least one additional (e.g., second) metal (e.g., $RE_wM_yO_z$, $Y_xZr_yO_z$ or $RE_wY_xZr_yO_z$) co-deposited in a single adsorption layer. The at least one rare earth metal may be selected from yttrium, erbium, lanthanum, lutetium, scandium, gadolinium, samarium or dysprosium. Alternatively, the coatings may be formed of tantalum and at least one additional metal. The at least one additional metal may be selected from a rare earth metal (RE), zirconium (Zr), aluminum (Al), hafnium (Hf) and silicon (Si) in embodiments. According to embodiments, the rare earth metal containing oxide coating can contain about 5 mol % to about 30 mol %, or about 10 mol % to about 25 mol %, or about 15 mol % to about 20 mol % of at least one rare earth metal and about 1 mol % to about 40 mol %, or about 5 mol % to about 30 mol %, or about 10 mol % to about 20 mol % of at least one additional metal.

The coatings provide resistance to erosion by plasmas (e.g., bromine containing plasmas) used for semiconductor processing and chamber cleaning. Therefore, the coatings provide good particle performance and process stability performance during such processing and cleaning procedures. As used herein, the terms "erosion resistant coating" or "plasma resistant coating" refer to a coating having a particularly low erosion rate when exposed to particular plasmas, chemistry and radicals (e.g., fluorine-based plasma, chemistry and/or radicals, bromine-based plasma, chemistry and/or radicals, chlorine-based plasma, chemistry and/or radicals, etc.). The co-deposition scheme described in embodiments eliminates mechanical segregation that results from sequentially depositing different metal oxides in separate layers, achieves a much more uniform coating at the angstrom scale, and provides an improved phase control (e.g., lack of inter-diffusion that leaves distinct $Y_2O_3$ and $ZrO_2$ phases in the coating). According to embodiments, the co-deposition scheme results in a coating having a homogenous mixture of the metals and, without being bound to any particular theory, it is believed may eliminate vacancies within the co-deposited coating thereby preventing fluorine to diffuse into the coating. For example, a coating comprising a mixture of $Y_2O_3$ and $ZrO_2$ as deposited by a deposition technique other than ALD or deposited by ALD using a sequential deposition technique may include one or more segregated phases at some locations. This may result in some vacancies for the $Y_2O_3$ phase, which may increase a susceptibility to fluorination. In contrast, ALD deposition of $Y_xZr_yO_z$ (e.g., a $Y_2O_3$—$ZrO_2$ solid solution) using a co-deposition technique and/or a co-dosing technique may reduce or eliminate phase segregation and result in a homogenous mixture of Y and Zr. The co-deposition scheme also provides the flexibility of adjusting the ratio of deposited metals, for example, by adjusting the number of pulses and/or the pulsing time, temperature, pressure, etc. This flexibility enables the formation of coatings having particular mole ratios of two or more metals.

In embodiments, the complex metal oxide coating may include a two metal composition ($M1_xM2_yO_z$), a three metal composition ($M1_xM2_xM3_yO_z$), a four metal composition ($M1_wM2_xM3_xM4_yO_z$), a five metal composition ($M1_wM2_wM3_wM4_xM5_yO_z$), a six metal composition ($M1_tM2^uM3_vM4_wM5_xM6_yO_z$), and so on. In each of the complex metal oxide coatings, the variables t, u, v, w, x, y, z may be positive integers or decimal values. Some example values of t, u, v, w, x, y, z may range from about 0.1 to about 10. In some embodiments the complex metal oxide coating is a rare earth metal containing oxide coating. In embodiments, the rare earth metal containing oxide coating is selected from $Y_xZr_yO_z$, $Er_xZr_yO_z$, $Y_wEr_xZr_yO_z$, $Y_wEr_xHf_yO_z$, $Y_wZr_xHf_yO_z$, $Er_wZr_xHf_yO_z$, $Y_vEr_wZr_xHf_yO_z$, $Y_xHf_yO_z$, $Er_xHf_yO_z$, $Y_xTa_yO_z$, $Er_xTa_yO_z$, $Y_wEr_xTa_yO_z$, $Y_wTa_xZr_yO_z$, $Y_wTa_xHf_yO_z$, $Er_wTa_xZr_yO_z$, $Er_wTa_xHf_yO_z$ and $Y_vEr_wTa_xHf_yO_z$. In one embodiment, the rare earth metal containing oxide coating can include about 28.6 mol % yttrium, about 9.5 mol % zirconium and about 61.9 mol % oxygen (corresponding to about 60 mol % $Y_2O_3$ and about 40 mol % $ZrO_2$ if in separated phases). In another embodiment, the rare earth metal containing oxide coating can include about 31.8 mol % yttrium, about 6.8 mol % zirconium and about 61.36 mol % oxygen (corresponding to about 70 mol % $Y_2O_3$ and about 30 mol % $ZrO_2$ if in separated phases). In further embodiments, the rare earth metal containing oxide coating may include a composition selected from $La_wY_xZr_yO_z$, $Lu_wY_xZr_yO_z$, $Sc_wY_xZr_yO_z$, $Gd_wY_xZr_yO_z$, $Sm_wY_xZr_yO_z$, $Dy_wY_xZr_yO_z$, $La_wY_xZr_yO_z$, $Lu_wY_xTa_yO_z$, $Sc_wY_xTa_yO_z$, $Gd_wY_xTa_yO_z$, $Sm_wY_xTa_yO_z$, $Dy_wY_xTa_yO_z$, $Er_wY_xHf_yO_z$, $La_wY_xHf_yO_z$, $Lu_wY_xHf_yO_z$, $Sc_wY_xHf_yO_z$, $Gd_wY_xHf_yO_z$, $Sm_wY_xHf_yO_z$, $Dy_wY_xHf_yO_z$. In some embodiments, the coatings may contain $RE_wZr_xAl_yO_z$, for example, $Y_wZr_xAl_yO_z$. Other complex oxides may also be used.

Examples of yttrium-containing oxide compounds that the plasma resistant coating may be formed of include $Y_2O_3$, $Y_xAl_yO_z$ (e.g., $Y_3Al_5O_{12}$), $Y_xZr_yO_z$, $Y_xHf_yO_z$, $Y_aZr_xAl_yO_z$, $Y_aZr_xHf_yO_z$, $Y_aHf_xAl_yO_z$, $Y_vZr_wHf_xAl_yO_z$, or $Y_xEr_yO_z$. The yttrium content in the coating may range from about 0.1 mol % to close to 100 mol %. For yttrium-containing oxides, the yttrium content may range from about 0.1 mol % to close to 100 mol % and the oxygen content may range from about 0.1 mol % to close to 100 mol %.

Examples of erbium-containing oxide compounds that the plasma resistant coating may be formed of include $Er_2O_3$, $Er_xAl_yO_z$ (e.g., $Er_3Al_5O_{12}$), $Er_xZr_yO_z$, $Er_xHf_yO_z$, $Er_aZr_xAl_yO_z$, $Er_aZr_xHf_yO_z$, $Er_aHf_xAl_yO_z$, $Y_xEr_yO_z$, and $Er_aY_xZr_yO_z$ (e.g., a single phase solid solution of $Y_2O_3$, $ZrO_2$ and $Er_2O_3$). The erbium content in the plasma resistant coating may range from about 0.1 mol % to close to 100 mol %. For erbium-containing oxides, the erbium content may range from about 0.1 mol % to close to 100 mol % and the oxygen content may range from about 0.1 mol % to close to 100 mol %.

Advantageously, $Y_2O_3$ and $Er_2O_3$ are miscible. A single phase solid solution can be formed for any combination of $Y_2O_3$ and $Er_2O_3$. For example, a mixture of just over 0 mol % $Er_2O_3$ and just under 100 mol % $Y_2O_3$ may be combined and co-deposited to form a plasma resistant coating that is a single phase solid solution. Additionally, a mixture of just over 0 mol % $E_2O_3$ and just under 100 mol % $Y_2O_3$ may be combined to form a plasma resistant coating that is a single phase solid solution. Plasma resistant coatings of $Y_xEr_yO_z$ may contain between over 0 mol % to under 100 mol % $Y_2O_3$ and over 0 mol % to under 100 mol % $Er_2O_3$. Some notable examples include 90-99 mol % $Y_2O_3$ and 1-10 mol % $Er_2O_3$, 80-89 mol % $Y_2O_3$ and 11-20 mol % $Er_2O_3$, 70-79 mol % $Y_2O_3$ and 21-30 mol % $Er_2O_3$, 60-69 mol % $Y_2O_3$ and 31-40 mol % $Er_2O_3$, 50-59 mol % $Y_2O_3$ and 41-50 mol % $Er_2O_3$, 40-49 mol % $Y_2O_3$ and 51-60 mol % $Er_2O_3$, 30-39 mol % $Y_2O_3$ and 61-70 mol % $Er_2O_3$, 20-29 mol % $Y_2O_3$ and 71-80 mol % $Er_2O_3$, 10-19 mol % $Y_2O_3$ and 81-90 mol % $Er_2O_3$, and 1-10 mol % $Y_2O_3$ and 90-99 mol % $Er_2O_3$. The single phase solid solution of $Y_xEr_yO_z$ may have a monoclinic cubic state at temperatures below about 2330° C.

Advantageously, $ZrO_2$ may be combined with $Y_2O_3$ and $Er_2O_3$ to form a single phase solid solution containing a mixture of the $ZrO_2$, $Y_2O_3$ and $Er_2O_3$ (e.g., $Er_aY_xZr_yO_z$). The solid solution of $Y_aEr_xZr_yO_z$ may have a cubic, hexagonal, tetragonal and/or cubic fluorite structure. The solid solution of $Y_aEr_xZr_yO_z$ may contain over 0 mol % to 60 mol % $ZrO_2$, over 0 mol % to 99 mol % $Er_2O_3$, and over 0 mol % to 99 mol % $Y_2O_3$. Some notable amounts of $ZrO_2$ that may be used include 2 mol %, 5 mol %, 10 mol %, 15 mol %, 20 mol %, 30 mol %, 50 mol % and 60 mol %. Some notable amounts of $Er_2O_3$ and/or $Y_2O_3$ that may be used include 10 mol %, 20 mol %, 30 mol %, 40 mol %, 50 mol %, 60 mol %, 70 mol %, 80 mol %, and 90 mol %.

Plasma resistant coatings of $Y_aZr_xAl_yO_z$ may contain over 0% to 60 mol % $ZrO_2$, over 0 mol % to 99 mol % $Y_2O_3$, and over 0 mol % to 60 mol % $Al_2O_3$. Some notable amounts of $ZrO_2$ that may be used include 2 mol %, 5 mol %, 10 mol %, 15 mol %, 20 mol %, 30 mol %, 50 mol % and 60 mol %. Some notable amounts of $Y_2O_3$ that may be used include 10 mol %, 20 mol %, 30 mol %, 40 mol %, 50 mol %, 60 mol %, 70 mol %, 80 mol %, and 90 mol %. Some notable amounts of $Al_2O_3$ that may be used include 2 mol %, 5 mol %, 10 mol %, 20 mol %, 30 mol %, 40 mol %, 50 mol % and 60 mol %. In one example, the plasma resistant coating of $Y_aZr_xAl_yO_z$ contains 42 mol % $Y_2O_3$, 40 mol % $ZrO_2$ and 18 mol % $Y_2O_3$ and has a lamellar structure. In another example, the plasma resistant coating of $Y_aZr_xAl_yO_z$ contains 63 mol % $Y_2O_3$, 10 mol % $ZrO_2$ and 27 mol % $Er_2O_3$ and has a lamellar structure.

In embodiments, the rare earth metal containing oxide coating contains about 1 mol % to about 40 mol %, or about 5 mol % to about 30 mol % of a first metal (e.g., a rare earth metal such as yttrium, erbium, etc.) and about 1 mol % to about 40 mol %, or about 1 mol % to about 20 mol % of a second metal (e.g., a rare earth metal, Zr, Hf, Ta, Al, Si). In further embodiments, the complex metal oxide coating contains about 1 mol % to about 40 mol %, or about 5 mol % to about 30 mol % of Ta and about 1 mol % to about 40 mol %, or about 1 mol % to about 20 mol % of the second metal (e.g., RE, Zr, Hf, Al, Si). In embodiments, the coating contains about 5 mol % to about 30 mol % yttrium and about 1 mol % to about 20 mol % zirconium, hafnium or tantalum, or about 10 mol % to about 25 mol % yttrium and about 5 mol % to about 17 mol % Zr, Hf or Ta, or about 15 mol % to about 21.5 mol % yttrium and about 10 mol % to about 14.5 mol % Zr, Hf, Al, Ta or Si. In embodiments, the complex metal oxide coating contains about 1 mol % to about 40 mol %, or about 5 mol % to about 30 mol % yttrium and about 1 mol % to about 40 mol %, or about 1 mol % to about 20 mol % zirconium, hafnium or tantalum, or about 10 mol % to about 25 mol % yttrium and about 5 mol % to about 17 mol % Zr, Hf or Ta, or about 15 mol % to about 21.5 mol % yttrium and about 10 mol % to about 14.5 mol % Zr, Hf or Ta. In embodiments, the coating contains a mixture of Y and Er, where the combined mol % of the Y and Er is about 1 mol % to about 40 mol %, or about 5 mol % to about 30 mol % (e.g., may contain 1-29 mol % Y and 1-29 mol % Er). The coating may additionally contain about 1 mol % to about 40 mol %, or about 1 mol % to about 20 mol % zirconium, hafnium or tantalum.

In embodiments, the thickness of the complex metal oxide coating or rare earth metal containing oxide coating may be about 5 nm to about 10 µm, or about 5 nm to about 5 µm, or about 25 nm to about 5 µm, or about 50 nm to about 500 nm, or about 75 nm to about 200 nm. In some embodiments, the thickness of the complex metal oxide coating or the rare earth metal containing oxide coating may be about 50 nm, or about 75 nm, or about 100 nm, or about 125 nm, or about 150 nm. The complex metal oxide coating or the rare earth metal containing oxide coating may conformally cover one or more surfaces of a body of an article (including high aspect ratio features such as gas holes) with a substantially uniform thickness. In one embodiment, the complex metal oxide coating or rare earth metal containing oxide coating has a conformal coverage of the underlying surface that is coated (including coated surface features) with a uniform thickness having a thickness variation of less than about +/−20%, a thickness variation of +/−10%, a thickness variation of +/−5%, or a lower thickness variation.

In further embodiments, the complex metal oxide coating or the rare earth metal containing oxide coating does not contain separate layers containing an oxide of the first metal and an oxide of the second metal (or the third metal, fourth metal, etc.). In particular, in certain embodiments, the complex metal oxide coating or the rare earth metal containing oxide coating may not be formed by sequential atomic layer deposition cycles of the multiple metals. Rather, the first metal and the second metal, for example, may be co-deposited onto the article or the body of the article in embodiments. Consequently, the rare earth metal containing oxide coating may be free of mechanical segregation between a layer containing the first metal and a layer containing the second metal. As a further result of the co-deposition process, the complex metal oxide coating or the rare earth metal containing oxide coating may contain a homogenous mixture of the first metal (e.g., a rare earth metal) and the second metal without performing annealing and also may not comprise a concentration gradient of the first metal or the second metal resulting from incomplete inter-diffusion of the materials in the coating.

In alternative embodiments, a sequential atomic layer deposition (ALD) process is performed. For the sequential ALD process a first metal precursor may be adsorbed onto a surface, and an oxygen-based reactant may react with the adsorbed first metal (e.g., a rare earth metal, tantalum, etc.) to form a first metal oxide layer. Subsequently a second metal precursor may be adsorbed onto the first metal oxide layer, and an oxygen-based reactant may react with the adsorbed second metal (e.g., zirconium, aluminum, hafnium, tantalum, silicon, etc.) to form a second metal oxide layer. The metals from the first and second metal oxide layers may then interdiffuse into one another. When a coating is deposited using sequential deposition cycles of a first metal and a second metal, annealing may be performed to affect inter-diffusion between the layers. Such annealing can result in a concentration gradient of the phases of the metals (e.g., $Y_2O_3$ and $ZrO_2$ to YZrO) from the surface toward the underlying article, and such coatings lack homogeneity throughout. The coatings described herein by co-deposition form homogenous mixtures of the first metal and the second metal. No annealing is generally performed to implement inter-diffusion.

According to embodiments, the complex metal oxide coating or rare earth metal containing oxide coating may be formed of a multilayer stack having alternating layers of material. In one embodiment, a buffer layer may be deposited on the surface of the article or a body of the article, and the complex metal oxide coating or rare earth metal containing oxide coating may be deposited on the buffer layer. The buffer layer may include, but is not limited to, an aluminum oxide (e.g., $Al_2O_3$), a silicon oxide (e.g., $SiO_2$), aluminum nitride or combinations thereof. In other embodiments, the first metal (e.g., yttrium, erbium, tantalum, etc.) and the second metal (e.g., a rare earth metal, zirconium, aluminum, hafnium, tantalum, etc.) may be co-deposited onto the article (or onto the buffer layer, if used) using ALD to form a first co-deposition layer. A second layer of material (e.g., a metal oxide, a rare earth metal oxide, a co-deposited rare earth metal zirconium oxide, and so on) may be deposited or co-deposited on the first co-deposition layer. Each deposition or co-deposition cycle can be repeated as many times as desired to achieve a target composition and/or thickness of the final multilayer coating.

The thickness of each layer in the multilayer complex metal oxide coating or rare earth metal containing oxide coating may be from about 10 nm to about 1.5 µm. In embodiments, the buffer layer (e.g., amorphous $Al_2O_3$) may have a thickness of about 1.0 µm and the rare earth metal-containing oxide layer may have a thickness of about 50 nm. A ratio of the complex metal oxide coating or rare earth metal-containing oxide layer thickness to the buffer layer thickness may be 200:1 to 1:200, or about 100:1 to 1:100, or about 50:1 to about 1:50. The thickness ratio may be selected in accordance with specific chamber applications.

The complex metal oxide coating or rare earth metal containing oxide coating may be grown or co-deposited using ALD with precursors for co-deposition of a first metal oxide layer containing tantalum and/or at least one rare earth metal (e.g., yttrium, erbium, etc.) and a second metal (e.g., RE, Zr, Ta, Hf, Al, Si). In one embodiment, the complex metal oxide coating or rare earth metal containing oxide coating has a polycrystalline structure.

The buffer layer may include amorphous aluminum oxide or similar material. The buffer layer provides robust mechanical properties and may enhance dielectric strength, provide better adhesion of the complex metal oxide coating or rare earth metal containing oxide coating to the component (e.g., formed of Al6061, Al6063 or ceramic), and prevent cracking of the complex metal oxide coating or rare earth metal containing oxide coating at temperatures up to about 350° C., or up to about 300° C., or up to about 250° C., or up to about 200° C., or from about 200° C. to about 350° C., or from about 250° C. to about 300° C. Such metal articles have a coefficient of thermal expansion that may be significantly higher than the coefficient of thermal expansion of a complex metal oxide coating or a rare earth metal containing oxide coating. By first applying the buffer layer 209, the detrimental effect of mismatch in coefficients of thermal expansion between the article and the complex metal oxide coating may be managed. Since ALD is used for the deposition, the internal surfaces of high aspect ratio features such as gas delivery holes in a showerhead or a gas delivery line may be coated, and thus an entirety of a component may be protected from exposure to a corrosive environment. In some embodiments, the buffer layer may include a material that has a thermal expansion coefficient between the value of the article's thermal expansion coefficient and the value of the complex metal containing oxide coating thermal expansion coefficient. Additionally, the buffer layer may act as a barrier that prevents migration of metal contaminants (e.g., Mg, Cu, etc. trace metals) from the component or article into the complex metal oxide coating. The addition of the amorphous $Al_2O_3$ layer as a buffer layer under the complex metal oxide coating may increase the thermal resistance of the complex metal oxide coating as a whole by relieving the elevated stress concentrated at some areas of the complex metal oxide/Al6061 interface.

The buffer layer may be $Al_2O_3$, such as amorphous $Al_2O_3$, in embodiments. Amorphous $Al_2O_3$ may have a higher temperature capability than, for example, a rare earth metal containing oxide. Therefore, the addition of an amorphous $Al_2O_3$ layer as a buffer layer under a complex metal oxide coating may increase the thermal resistance of the complex metal oxide coating as a whole by relieving the elevated stress concentrated at some areas of the complex metal oxide/Al6061 interface. Moreover, $Al_2O_3$ has good adhesion to an aluminum based component because of common elements (i.e., the aluminum). Similarly, $Al_2O_3$ has good adhesion to complex metal oxides also because of common elements (i.e., the oxides). These improved interfaces reduce interfacial defects which are prone to initiate cracks. Additionally, the amorphous $Al_2O_3$ layer may act as a barrier that prevents migration of metal contaminants (e.g., Mg, Cu, etc. trace metals) from the component or article into the rare earth metal-containing oxide layer.

Also described herein are articles having a complex metal oxide coating or rare earth metal containing oxide coating as described above. In embodiments, the article may be any type of component for use in a semiconductor processing chamber including, but not limited to, an electrostatic chuck, a gas delivery plate, a chamber wall, a chamber liner, a door, a ring, a showerhead, a nozzle, a plasma generation unit, a radiofrequency electrode, an electrode housing, a diffuser an a gas line. The article may contain a material including, but not limited to, aluminum (Al), silicon (Si), copper (Cu) and magnesium (Mg). In embodiments, the article may contain a ceramic material including, but not limited to, an aluminum oxide ($Al_xO_y$), a silicon oxide ($Si_xO_y$), aluminum nitride (AlN) or silicon carbide (SiC) material. In some embodiments, the article or a body of an article may be an aluminum Al 6061, Al 6063 material. In some embodiments, the surface of the article or the body of the article has a surface roughness of about 120 µin to about 180 µin, or about 130 µin to about 170 µin, or about 140 µin to about 160 µin.

The complex metal oxide coating may be very dense with a porosity of about 0% (e.g., the rare earth metal containing oxide coating may be porosity-free in embodiments). The complex metal oxide coating may be resistant to corrosion and erosion from plasma etch chemistries, such as $CCl_4$/$CHF_3$ plasma etch chemistries, $HCl_3Si$ etch chemistries, $NF_3$ and bromine containing etch chemistries. Additionally, the complex metal oxide coatings described herein having the buffer layer may be resistant to cracking and delamination at temperatures up to about 350° C. For example, a chamber component having the rare earth metal containing oxide coating and buffer layer described herein may be used in processes that include heating to temperatures of about 200° C. The chamber component may be thermally cycled between room temperature and the temperature of about 200° C. without introducing any cracks or delamination in the rare earth metal containing oxide coating.

In some embodiments, the article or the body of the article may include at least one feature (e.g., a gas hole), wherein the feature has an aspect ratio of length to diameter (L:D) of about 5:1 to about 300:1, or about 10:1 to about 200:1, or about 20:1 to about 100:1, or about 5:1 to about 50:1, or about 7:1 to about 25:1, or about 10:1 to about 20:1. The r complex metal oxide coating or rare earth metal containing oxide coating may conformally cover the body of the article and a surface of the feature. In some embodiments, the article or the body of the article may include a feature (e.g., a channel) having an aspect ratio of depth to width (D:W) of ab about 5:1 to about 300:1, or about 10:1 to about 200:1, or about 20:1 to about 100:1, or about 5:1 to about 50:1, or about 7:1 to about 25:1, or about 10:1 to about 20:1. The complex metal oxide coating or rare earth metal containing oxide coating may conformally cover the body of the article and a surface of the feature.

In various embodiments, high aspect ratio features of the articles (as described above) may be effectively coated with complex metal oxide coating or rare earth metal containing oxide coatings described herein. The complex metal oxide coatings may have a single phase, two phases, or more than two phases. The complex metal oxide coatings or rare earth metal containing oxide coatings are conformal within the high aspect ratio feature and may cover the feature with a substantially uniform thickness as described above. FIG. 1 is a sectional view of a semiconductor processing chamber 100 having one or more chamber components that are coated with a complex metal oxide coating or rare earth metal containing oxide coating in accordance with embodiments described herein. The base materials of at least some components of the chamber may include one or more of Al (e.g., $Al_xO_y$, AlN, Al 6061, or Al 6063), Si (e.g., $Si_xO_y$, $SiO_2$, or SiC), copper (Cu), magnesium (Mg), titanium (Ti) and stainless steel (SST). The processing chamber 100 may be used for processes in which a corrosive plasma environment (e.g., a bromine containing plasma) having plasma processing conditions is provided. For example, the processing chamber 100 may be a chamber for a plasma etcher or plasma etch reactor, a plasma cleaner, plasma enhanced CVD or ALD reactors and so forth. Examples of chamber components that may include the complex metal oxide coating or rare earth metal containing oxide coating include chamber components with complex shapes and features having high aspect ratios as described above. Some exemplary chamber components include a substrate support assembly, an electrostatic chuck, a ring (e.g., a process kit ring or single ring), a chamber wall, a base, a gas distribution plate, a showerhead, gas lines, a nozzle, a lid, a liner, a liner kit, a shield, a plasma screen, a flow equalizer, a cooling base, a chamber viewport, a chamber lid, and so on.

In one embodiment, the processing chamber 100 includes a chamber body 102 and a showerhead 130 that enclose an interior volume 106. The showerhead 130 may include a showerhead base and a showerhead gas distribution plate. Alternatively, the showerhead 130 may be replaced by a lid and a nozzle in some embodiments, or by multiple pie shaped showerhead compartments and plasma generation units in other embodiments. The chamber body 102 may be fabricated from aluminum, stainless steel or other suitable material. The chamber body 102 generally includes sidewalls 108 and a bottom 110. An outer liner 116 may be disposed adjacent the sidewalls 108 to protect the chamber body 102. Any of the showerhead 130 (or lid and/or nozzle), sidewalls 108 and/or bottom 110 may include the rare earth metal containing oxide coating.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The showerhead 130 may be supported on the sidewall 108 of the chamber body 102. The showerhead 130 (or lid) may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through the showerhead 130 or lid and nozzle. Showerhead 130 may be used for processing chambers used for dielectric etch (etching of dielectric materials). The showerhead 130 may include a gas distribution plate (GDP) having multiple gas delivery holes 132 throughout the GDP. The showerhead 130 may include the GDP bonded to an aluminum base or an anodized aluminum base. The GDP may be made from Si or SiC, or may be a ceramic such as $Y_2O_3$, $Al_2O_3$, $Y_3Al_5O_{12}$ (YAG), and so forth.

For processing chambers used for conductor etch (etching of conductive materials), a lid may be used rather than a showerhead. The lid may include a center nozzle that fits into a center hole of the lid. The lid may be a ceramic such as $Al_2O_3$, $Y_2O_3$, YAG, or a ceramic compound comprising $Y_4Al_2O_9$ and a solid-solution of $Y_2O_3$—$ZrO_2$. The nozzle may also be a ceramic, such as $Y_2O_3$, YAG, or the ceramic compound comprising $Y_4Al_2O_9$ and a solid-solution of $Y_2O_3$—$ZrO_2$.

Examples of processing gases that may be used to process substrates in the processing chamber 100 include halogen-containing gases, such as $C_2F_6$, $SF_6$, $SiCl_4$, HBr, $NF_3$, $CF_4$, $CHF_3$, $CH_2F_3$, F, $NF_3$, $Cl_2$, $CCl_4$, $BCl_3$ and $SiF_4$, among others, and other gases such as $O_2$, or $N_2O$. Examples of carrier and purge gases include $N_2$, He, Ar, and other gases inert to process gases (e.g., non-reactive gases).

A substrate support assembly 148 is disposed in the interior volume 106 of the processing chamber 100 below the showerhead 130 or lid. The substrate support assembly 148 includes a support 136 that holds the substrate 144 during processing. The support 136 is attached to the end of a shaft (not shown) that is coupled to the chamber body 102 via a flange 164. The substrate support assembly 148 may include, for example, a heater, an electrostatic chuck, a susceptor, a vacuum chuck, or other substrate support assembly component.

Figure 2C:
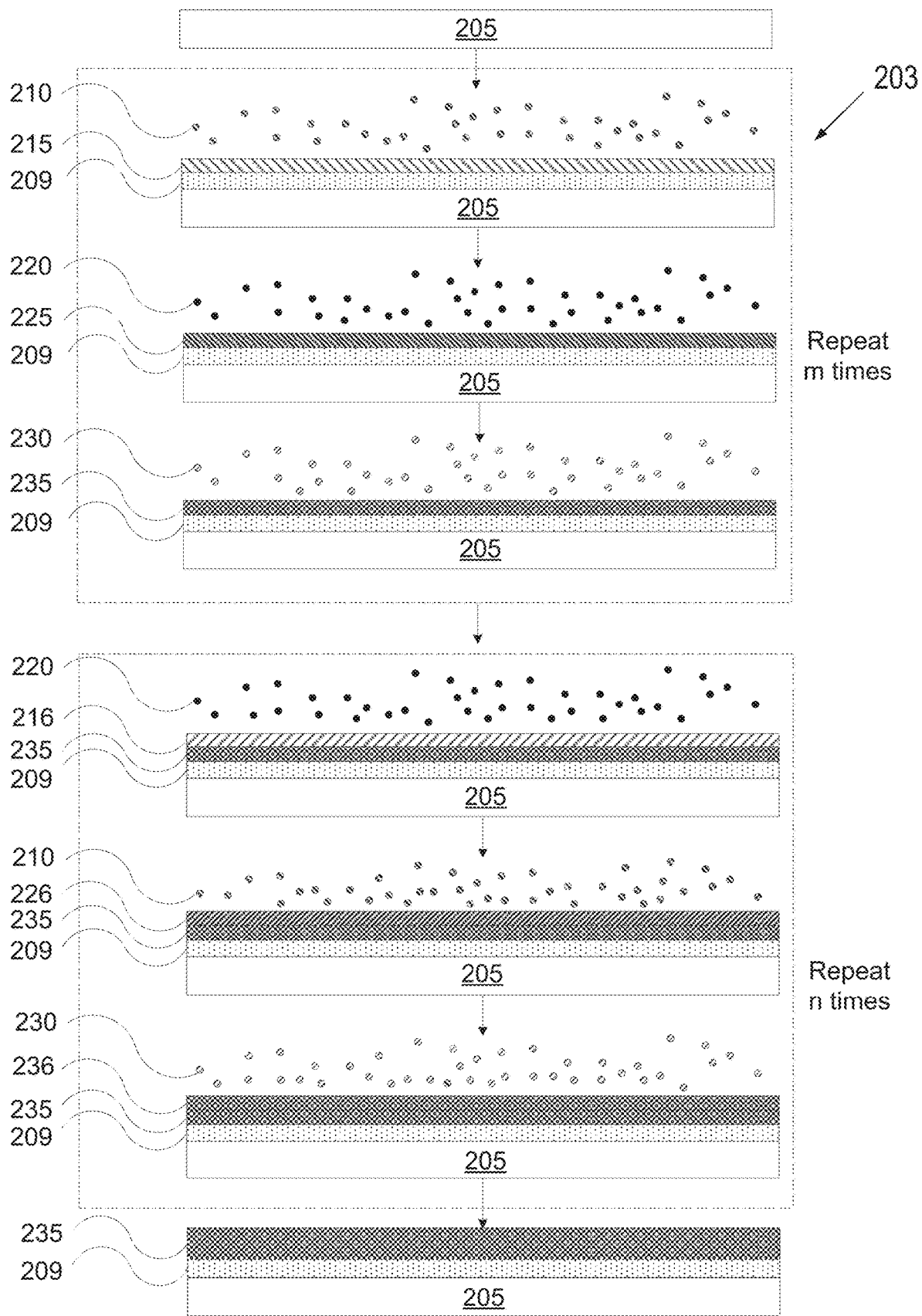
FIG. 2C depicts another embodiment of a co-deposition process in accordance with an atomic layer deposition technique as described herein.
Figure 2D:
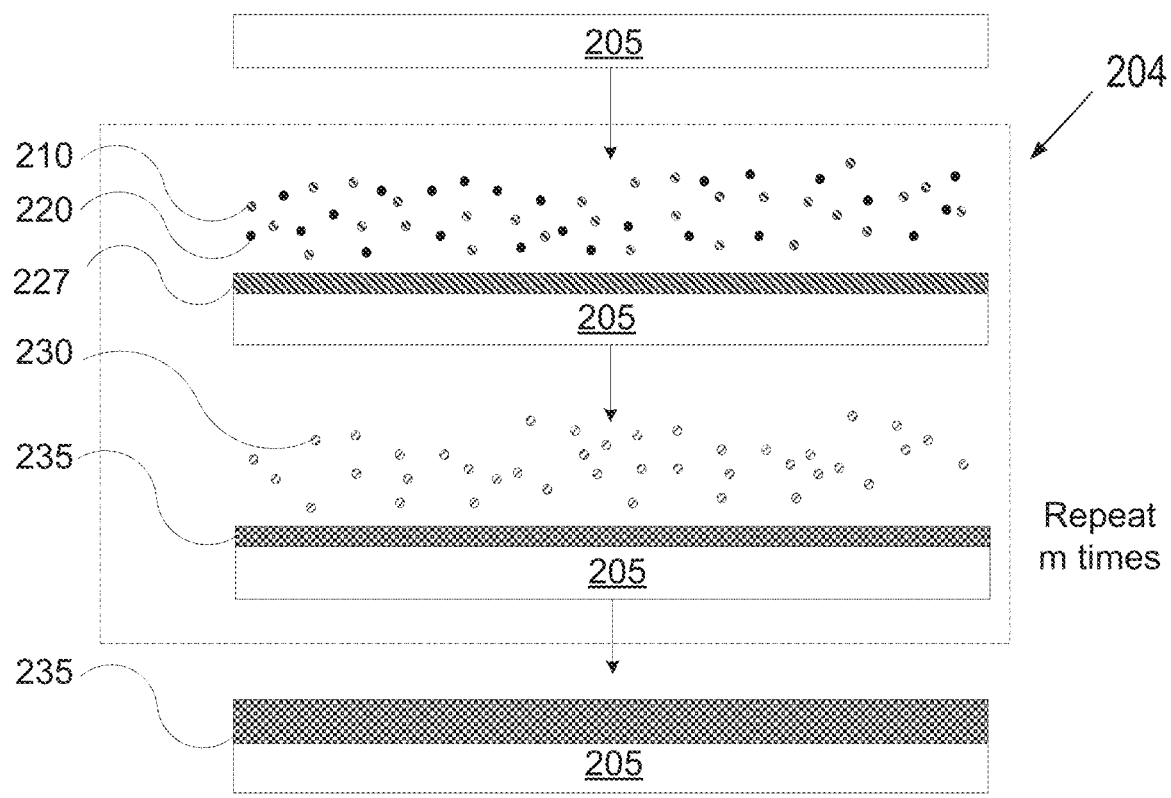
FIG. 2D depicts another embodiment of a co-deposition process in accordance with an atomic layer deposition technique as described herein.

FIG. 2A depicts an embodiment of a co-deposition process 200 in accordance with an ALD technique to grow or deposit a first metal-rich oxide coating on an article. FIG. 2B depicts another embodiment of a co-deposition process in accordance with an ALD technique as described herein to grow or deposit a second metal-rich rare earth metal oxide coating on an article. FIG. 2C depicts another embodiment of a co-deposition process in accordance with an ALD technique as described herein. FIG. 2D depicts another embodiment of a co-deposition process that utilizes co-dosing of the rare earth metal and other metal in accordance with an ALD technique as described herein.

For ALD co-deposition processes, either adsorption of at least two precursors onto a surface or a reaction of a reactant with the adsorbed precursors may be referred to as a "half-reaction." During a first half reaction, a first precursor (or a mixture of precursors) may be pulsed onto a surface of the article 205 for a period of time sufficient to allow the precursor to partially (or fully) adsorb onto the surface. The adsorption is self-limiting as the precursor will adsorb onto a number of available sites on the surface, forming a partial adsorption layer of a first metal on the surface. Any sites that have already adsorbed with the first metal of the precursor will become unavailable for further adsorption with a subsequent precursor. Alternatively, some sites that have become adsorbed with the first metal of the first precursor may be displaced with a second metal of a second precursor that is adsorbed at the site. To complete the first half reaction, a second precursor may be pulsed onto a surface of the article 205 for a period of time sufficient to allow a second metal of the second precursor to (partially or fully) adsorb onto available sites on the surface (and possibly to displace the first metal of the first precursor), forming a co-deposition adsorption layer on the surface.

A co-deposition cycle of an ALD process starts with a first precursor (i.e., a chemical A or a mixture of chemicals A and B) being flooded into an ALD chamber and partially (or fully) adsorbed onto surfaces of the article (including surfaces of holes and features within the articles). A second precursor (i.e., a chemical B) may be flooded into the ALD chamber and adsorbed onto remaining exposed surfaces of the article. The excess precursor may then be flushed out/purged (i.e., with an inert gas) of the ALD chamber before a reactant (i.e., a chemical R) is introduced into the ALD chamber and subsequently flushed out. Alternatively, or additionally, the chamber may be purged during the first half reaction between deposition of the first precursor and the second precursor. For ALD, the final thickness of material is dependent on the number of reaction cycles that are run because each reaction cycle will grow a layer of a certain thickness that may be one atomic layer or a fraction of an atomic layer.

Aside from being a conformal process, ALD is also a uniform process and is capable of forming very thin films, for example, having a thickness of about 3 nm or more. All exposed surfaces of the article will have the same or approximately the same amount of material deposited. The ALD technique can deposit a thin layer of material at a relatively low temperature (e.g., about 25° C. to about 350° C.) so that it does not damage or deform any materials of the component. Additionally, the ALD technique can also deposit a layer of material within complex features (e.g., high aspect ratio features) of the component. Furthermore, the ALD technique generally produces relatively thin (i.e., 1 μm or less) coatings that are porosity-free (i.e., pin-hole free), which may eliminate crack formation during deposition.

The complex metal oxide coating or rare earth metal containing oxide coating may be grown or deposited using ALD with a first metal containing precursor (e.g., a rare earth metal containing precursor, a tantalum containing precursor, etc.), a second metal containing precursor and a reactant containing oxygen, for example, oxygen gas ($O_2$), water vapor ($H_2O$), ozone ($O_3$), oxygen radicals ($O^*$) or other oxygen-containing material. In some embodiments, the first metal containing precursor may contain yttrium, erbium, lanthanum, lutetium, scandium, gadolinium, samarium, dysprosium or tantalum.

In embodiments, the first metal containing precursor and the second metal containing precursor (and in the case of complex metal coatings, the third metal containing precursor, and the fourth metal containing precursor, etc.) are independently selected from a yttrium containing precursor, for example, tris(N,N-bis(trimethylsilyl)amide)yttrium (III), yttrium (III)butoxide, or a yttrium cyclopentadienyl compound (e.g., such as tris(cyclopentadienyl)yttrium($Cp_3Y$), tris(methylcyclopentadienyl)yttrium (($CpMe)_3Y$), tris(butylcyclopentadienyl)yttrium, tris(cyclopentadienyl)yttrium, or tris(ethylcyclopentadienyl)yttrum)). Other yttrium containing precursors that may be used include yttrium containing amide-based compounds (e.g., Tris(N,N'-di-i-propylformamidinato)yttrium, tris(2,2,6,6-tetramethyl-heptane-3,5-dionate)yttrium, or tris(bis(trimethylsilyl)amido)lanthanum) and yttrium containing beta-diketonate-based compounds. In some embodiments, the rare earth metal containing oxide precursor may include erbium. Erbium containing precursors include, but are not limited to, erbium containing cyclopentadienyl compounds, erbium containing amide-based compounds and erbium containing beta-diketonate-based compounds. Example erbium containing precursors include tris-methylcyclopentadienyl erbium(III) (Er(MeCp)$_3$), erbium boranamide (Er(BA)$_3$), Er(TMHD)$_3$, erbium(III)tris(2,2,6,6-tetramethyl-3,5-heptanedionate) and tris(butylcyclopentadienyl) erbium(III) for ALD. Zirconium containing precursors can include, but are not limited to, zirconium containing cyclopentadienyl compounds, zirconium containing amide-based compounds and zirconium containing beta-diketonate-based compounds. Example zirconium containing precursors include zirconium (IV) bromide, zirconium (IV) chloride, zirconium (IV) tert-butoxide, tetrakis(diethylamido)zirconium (IV), tetrakis(dimethylamido)zirconium (IV), tetrakis(ethylmethylamido)zirconium (IV), or a zirconium cyclopentadienyl compound for ALD. Some example zirconium containing precursors include tetrakis(dimethylamido)zirconium, tetrakis(diethylamido)zirconium, tetrakis(N,N'-dimethyl-formamidinate)zirconium, tetra(ethylmethylamido)hafnium, pentakis(dimethylamido) tantalum, and tris(2,2,6,6-tetramethyl-heptane-3,5-dionate) erbium.

In some embodiments, the first metal containing precursor and the second metal containing precursors may be independently selected from a cyclopentadienyl-based precursor, tris(methylcyclopentadienyl)yttrium (($CH_3Cp)_3Y$), tris(butylcyclopentadienyl)yttrium, tris(cyclopentadienyl)yttrium, tris(ethylcyclopentadienyl)yttrum, an amidinate-based precursor, Tris(N,N'-di-i-propylformamidinato)yttrium, tris(2,2,6,6-tetramethyl-heptane-3,5-dionate)yttrium, tris(bis(trimethylsilyl)amido)lanthanum, an amide-based precursor and a betadiketonate-based precursor.

In some embodiments, a mixture of two precursors is introduced (i.e., co-dosed) together, where the mixture includes a first percentage of a first metal containing precursor and a second percentage of a second metal containing precursor. For example, the mixture of precursors may include about 1 wt % to about 90 wt %, or about 5 wt % to about 80 wt % or about 20 wt % to about 60 wt % of a first metal containing precursor and about 1 wt % to about 90 wt %, or about 5 wt % to about 80 wt % or about 20 wt % to about 60 wt % of a second metal containing precursor. The mixture may include a ratio of the first metal (e.g., yttrium, tantalum, etc.) containing precursor to the second metal containing precursor that is suitable to form a target type of oxide material. The atomic ratio of the first metal (e.g., yttrium, tantalum, etc.) containing precursor to the second metal containing precursor may be about 200:1 to about 1:200, or about 100:1 to about 1:100, or about 50:1 to about 1:50, or about 25:1 to about 1:25, or about 10:1 to about 1:10, or about 5:1 to about 1:5.

In one embodiment, a complex metal oxide coating or rare earth metal containing oxide coating is co-deposited on a surface of an article using atomic layer deposition. Co-depositing the rare earth metal containing oxide coating may include contacting the surface with a first metal containing precursor (e.g., a rare earth metal containing precursor) for a first duration to form a partial metal adsorption layer. The first metal containing precursor can be one of a rare earth metal containing precursor, a zirconium containing precursor, a tantalum containing precursor, a hafnium containing precursor, an aluminum containing precursor, or a silicon containing precursor. Subsequently, the partial metal adsorption layer is contacted with a second metal containing precursor different from the first metal containing precursor for a second duration to form a co-adsorption layer containing the first metal and the second metal. The second metal containing precursor may be at least one of a rare earth metal containing precursor, a zirconium containing precursor, a hafnium containing precursor, a tantalum containing precursor containing precursor or an aluminum containing precursor. Thereafter, the co-adsorption layer is contacted with an oxygen source reactant to form the rare earth metal containing oxide coating. In certain embodiments, the coating may contain about 1 mol % to about 40 mol %, or about 5 mol % to about 30 mol % of a rare earth metal or tantalum and about 1 mol % to about 40 mol %, or about 1 mol % to about 20 mol % of a second metal. Additionally, the rare earth metal containing oxide coating contains a homogenous mixture of the first metal and the second metal.

Referring to FIG. 2A, described is a first metal (M1)—second metal (M2) co-deposition scheme 200 for depositing a rare earth metal containing oxide coating on an article 205. Article 205 may be introduced to a first metal containing precursor 210 (e.g., a rare earth metal containing precursor) for a duration until a surface of article 205 is partially adsorbed with the first metal containing precursor 210 to form a partial metal adsorption layer 215. Subsequently, article 205 may be introduced to a second metal containing precursor 220 for a duration until the remaining exposed surfaces of the article are adsorbed with the second metal containing precursor 220 to form a co-adsorption layer 225 containing the first metal and the second metal. The first metal containing precursor exposed to an uncoated surface (i.e., with all adsorption sites available) may more efficiently adsorb onto the surface than a second metal containing precursor that is exposed to the partially adsorbed surface. Therefore, co-adsorption layer 225 may be first metal-rich, that is, may contain a higher atomic concentration of the first metal than the second metal. Next, article 205 may be introduced to a reactant 230 for a duration to react with the co-adsorption layer 225 to grow a solid oxide layer (e.g., $Y_xZr_yO_z$ or a $Y_2O_3$—$ZrO_2$ solid solution) of a rare earth metal containing oxide coating 235 according to embodiments described herein. The precursors may be any of the precursors as set forth above. The co-deposition of the first metal and the second metal together with the introduction of the reactant is referred to as a M1-M2 co-deposition cycle. The M1-M2 co-deposition cycle can be repeated m times until a desired thickness of the coating is achieved.

Referring to FIG. 2B, described is a M2-M1 co-deposition scheme 202 for depositing a rare earth metal containing oxide coating on an article 205. Article 205 may be introduced to a second metal containing precursor 220 for a duration until a surface of article 205 is partially adsorbed with the second metal containing precursor 220 to form a partial metal adsorption layer 216. Subsequently, article 205 may be introduced to a first metal containing precursor 210 for a duration until the remaining exposed surfaces of the article are adsorbed with the first metal containing precursor 220 to form a co-adsorption layer 226. Co-adsorption layer 226 may be second metal-rich. Next, article 205 may be introduced to a first reactant 230 to react with the co-adsorption layer 225 to grow a solid layer (e.g., YZrO) of a rare earth metal containing oxide coating 236 according to embodiments described herein. The precursors may be any of the precursors as set forth above. The co-deposition of the second metal and the first metal together with the introduction of the reactant is referred to as a M2-M1 co-deposition cycle. The M2-M1 co-deposition cycle can be repeated n times until a desired thickness of the coating is achieved.

Each layer of the rare earth metal containing oxide coating 235, 236 may be uniform, continuous and conformal. The rare earth metal containing oxide coatings 235, 236 may be porosity free (e.g., have a porosity of 0) or have an approximately 0 porosity in embodiments (e.g., a porosity of 0% to 0.01%). Each layer of the rare earth metal containing oxide coating 235, 236 may have a thickness of less than one atomic layer to a few atoms in some embodiments after a single ALD deposition cycle. Some metalorganic precursor molecules are large. After reacting with the reactant, large organic ligands may be gone, leaving much smaller metal atoms. One full ALD cycle (e.g., that includes introduction of the precursors followed by introduction of the reactant) may result in less than a single atomic layer. Co-deposition scheme 200 may include repeating m co-deposition cycles to reach a target thickness for the coating 235. Similarly, co-deposition scheme 202 may include repeating n co-deposition cycles to reach a target thickness for the coating 236. M an N may be positive integer values.

The relative concentrations of the first metal (e.g., a rare earth metal, Ta, etc.) and the second metal may be controlled by the type of precursors used, by the temperature of the ALD chamber during adsorption of the precursors onto the surface of the article, the amount of time that the particular precursors remain in the ALD chamber, and the partial pressures of the precursors. For example, use of a tris(N,N-bis(trimethylsilyl)amide)yttrium (III) precursor may result in a lower atomic % of yttria than use of a yttrium cyclopentadienyl precursor.

In some embodiments, more than two types of metal precursors are adsorbed onto the surface of the article 205 in a single co-deposition cycle. For example, a co-deposition cycle may include adsorption of a yttrium precursor onto the surface, followed by adsorption of a zirconium precursor onto the surface, followed by adsorption of a hafnium precursor onto the surface. Each subsequent precursor may adsorb a lower amount of an associated metal onto the surface. Accordingly, the order in which the respective precursors are adsorbed onto the surface to create the co-adsorption layer can be selected to achieve a target ratio of the two or more different metals. An example additional co-deposition scheme that may be performed include a M1-M2-M3 co-deposition scheme in which a first metal (M1) is adsorbed onto the surface, followed by a second metal (M2) being adsorbed onto the surface, followed by a third metal (M3) being adsorbed onto the surface, followed by introduction of an oxygen source reactant. Another example co-deposition scheme that may be performed includes a M2-M1-M3 co-deposition scheme in which the second metal (M2) is adsorbed onto the surface, followed by the first metal (M1) being adsorbed onto the surface, followed by the third metal (M3) being adsorbed onto the surface, followed by introduction of an oxygen source reactant. Another example co-deposition scheme that may be performed includes a M3-M1-M2 co-deposition scheme in which the third metal (M3) is adsorbed onto the surface, followed by the first metal (M1) being adsorbed onto the surface, followed by the second metal (M2) being adsorbed onto the surface, followed by introduction of an oxygen source reactant. Another example co-deposition scheme that may be performed includes a M3-M2-M1 co-deposition scheme in which the third metal (M3) is adsorbed onto the surface, followed by the second metal (M2) being adsorbed onto the surface, followed by the first metal (M1) being adsorbed onto the surface, followed by introduction of an oxygen source reactant. Greater numbers of precursors may also be adsorbed onto the surface to create more complex metal oxides. The greater the number of metals used, the greater the number of possible permutations that are possible.

With reference to FIG. 2C, in some embodiments, a multi-layer stack may be deposited on article 205 using a co-deposition ALD process 203. An optional buffer layer 209 as described above may be deposited onto article 205. In an example where the buffer layer 209 is alumina ($Al_2O_3$), in a first half reaction, article 205 (e.g., an Al6061 substrate) may be introduced to an aluminum containing precursor (e.g., trimethyl aluminum (TMA)) (not shown) for a duration until all of the reactive sites on the surface are consumed. The remaining alumina containing precursor may be flushed out of the reaction chamber and then a reactant (not shown) of $H_2O$ or another oxygen source may be injected into the reactor to start the second half cycle. A buffer layer 209 of $Al_2O_3$ may be formed after $H_2O$ molecules react with the Al containing adsorption layer created by the first half reaction.

Buffer layer 209 may be uniform, continuous and conformal. The buffer layer 209 may be porosity free (e.g., have a porosity of 0) or have an approximately 0 porosity in embodiments (e.g., a porosity of 0% to 0.01%). Multiple full ALD deposition cycles may be implemented to deposit a buffer layer 209 having a target thickness, with each full cycle (e.g., including introducing the aluminum containing precursor, flushing, introducing H$_2$O reactant, and again flushing) adding to the thickness by an additional fraction of an atom to a few atoms. In embodiments, buffer layer 209 may have a thickness of about 10 nm to about 1.5 µm, or about 10 nm to about 15 nm, or about 0.8 µm to about 1.2 µm.

Subsequently, a M1-M2 co-deposition cycle in accordance with the description above relating to FIG. 2A or a M2-M1 co-deposition cycle in accordance with the description relating to FIG. 2B may be performed on article 205 having the optional buffer layer 209. The buffer layer 209, rather than the surface of the article or the body of the article, would be partially adsorbed with the first metal containing precursor 210 or second metal containing precursor 220 to form partial adsorption layer 215. Thereafter, the precursors may be flushed from the ALD chamber using an inert gas (e.g., nitrogen) and then a M2-M1 co-deposition cycle in accordance with the description above relating to FIG. 2B or a M1-M2 co-deposition cycle in accordance with the description above relating to FIG. 2A may be performed on article 205 having the optional buffer layer 209 and M1-M2 coating layer 235.

The rare earth metal containing oxide layer resulting from the M1-M2 co-deposition cycle may contain a first percentage of the first metal and a second percentage of the second metal. The M2-M1 co-deposition cycle results in an additional layer containing a third percentage of the first metal and a fourth percentage of the second metal. In embodiments, the third percentage may be lower than the first percentage and the fourth percentage may be higher than the third percentage. Thus, using the two co-deposition cycles, a multilayer coating having buffer layer 209, M1-M2 layer 235 and M2-M1 layer 236 can be formed. As before, either or both of the co-deposition cycles can be repeated m or n number of times, where m and n are each integers greater than zero and represent the number of co-deposition cycles. In some embodiments, the ratio of m to n can be 1:50 to about 50:1, or about 1:25 to about 25:1, or about 1:10 to about 10:1, or about 1:2 to about 2:1, or 1:1. The co-deposition cycles can be performed consecutively and/or in an alternating manner to build the coating. The alternating layers 235 and 236 described with respect to FIG. 2C were formed by the co-deposition cycles in a 1:1 manner, where there is a single layer of a M1-M2 coating layer for each single layer of a M2-M1 coating layer. However, in other embodiments there may be other patterns. For example, two M1-M2 co-deposition cycles may be followed by one M2-M1 co-deposition cycle (2:1), and then this sequence may be repeated again.

According to various embodiments, the M1-M2 co-deposition cycle can be represented as m*(M1+M2+O), where m is an integer greater than zero and represents the number of M1-M2 co-deposition cycles, M1 represents the amount (in mol %) of the first metal (e.g., a rare earth metal such as yttrium, tantalum, etc.) deposited, M2 represents the amount (mol %) of second metal deposited and O represents the amount (mol %) of oxygen deposited. The M2-M1 co-deposition cycle can be represented as n*(M2+M1+O), where n is an integer greater than zero and represents the number of M2-M1 co-deposition cycles, M2 represents the amount (mol %) of second metal deposited, M1 represents the amount (mol %) of the first metal (e.g., a rare earth metal such as yttrium, tantalum, etc.) deposited and O represents the amount (mol %) of oxygen deposited.

As shown in FIG. 2C, the following formula may be used to achieve a target composition of the rare earth metal containing coating: K*[m*(M1+M2+O)+n*(M2+M1+O)] where K is an integer greater than zero and represents a number of super-cycles that are performed to achieve a target thickness. By adjusting K, m and n, regardless of the chemical properties of the precursor, one can achieve a desired composition (e.g., a desired ratio of the first metal to the second metal) in the coating.

FIG. 2C illustrates co-deposition using two different metals. However, in further embodiments co-deposition may be performed with more than two metals, as described above. If more than two different metals are used, then there are more than two different co-deposition sequences that may be performed. For example, for a three metal co-deposition the following co-deposition schemes may be intermixed to achieve a coating with a target composition: M1+M2+M3+O, M1+M3+M2+O, M2+M1+M3+O, M2+M3+M1+O, M3+M1+M2+O, M3+M2+M1+O. Accordingly, the following formula may be used to achieve a target composition K*[a*(M1+M2+M3+O)+b*(M1+M3+M2+O)+c*(M2+M1+M3+O)+d*(M2+M3+M1+O)+e*(M3+M1+M2+O)+f*(M3+M2+M1+O)], where a, b, c, d, e and f are non-negative integers. The mol % of each of M1, M2 and M3 for each co-deposition scheme may be determined through experimentation. Similarly, for a four metal co-deposition the following co-deposition schemes may be intermixed to achieve a coating with a target composition: M1+M2+M3+M4+O, M1+M3+M4+M2+O, M1+M4+M2+M3+O, M1+M3+M2+M4+O, M1+M4+M3+M2+O, M1+M2+M4+M3+O, M2+M1+M3+M4+O, M2+M3+M4+M1+O, M2+M4+M1+M3+O, M2+M1+M4+M3+O, M2+M3+M1+M4+O, M2+M4+M3+M1+O, M3+M1+M2+M4+O, M3+M2+M4+M1+O, M3+M4+M1+M2+O, M3+M1+M4+M2+O, M3+M2+M1+M4+O, M3+M4+M2+M1+O, M4+M1+M2+M3+O, M4+M2+M3+M1+O, M4+M3+M1+M2+O, M4+M1+M3+M2+O, M4+M2+M1+M3+O, M4+M3+M3+M1+O. Accordingly, the following formula may be used to achieve a target composition K*[a*(M1+M2+M3+M4+O)+b*(M1+M3+M4+M2+O)+c*(M1+M4+M2+M3+O)+d*(M1+M3+M2+M4+O)+e*(M1+M4+M3+M2+O)+P(M1+M2+M4+M3+O)+g*(M2+M1+M3+M4+O)+h*(M2+M3+M4+M1+O)+i*(M2+M4+M1+M3+O)+j*(M2+M1+M4+M3+O)+k(M2+M3+M1+M4+O)+l*(M2+M4+M3+M1+O)+m*(M3+M1+M2+M4+O)+n*(M3+M2+M4+M1+O)+o*(M3+M4+M1+M2+O)+p*(M3+M1+M4+M2+O)+q*(M3+M2+M1+M4+O)+r*(M3+M4+M2+M1+O)+s*(M4+M1+M2+M3+O)+t*(M4+M2+M3+M1+O)+u*(M4+M3+M1+M2+O)+v*(M4+M1+M3+M2+O)+w*(M4+M2+M1+M3+O)+x*(M4+M3+M3+M1+O)], where a through x are non-negative integers.

A dose time ratio may be expressed as the ratio of the first metal (e.g., yttrium) precursor exposure time to the second metal precursor exposure time. It should be noted that the dose time and ratio of precursor materials are controllable whereas adhesion of the precursors to the surface, sticking coefficient and chemical interaction may not be. The pressure of the ALD chamber and the temperature also affect the adsorption of the precursors on the surface. For example, the reactivity of Zr is slightly higher than Y and so a resulting coating with a mixture of zirconium and yttrium may be zirconium-rich. Under equilibrium conditions in the chamber, the dose times can be adjusted to achieve a desired composition. At equilibrium, the composition is limited by the chemical reactivity of the precursors and the sticking coefficient of the materials. In some embodiments, there is no purge between the introduction of the first metal containing precursor and the second metal containing precursor because this could affect adsorption of the materials onto the article.

In embodiments, a ratio of a first number of M1-M2 co-deposition cycles and a second number of M1-M2 co-deposition cycles may be selected to result in a target first mol % of the first metal and a target second mol % of the second metal. Furthermore, a plurality of deposition supercycles may be performed, where each deposition supercycle includes performing the first number of M1-M2 co-deposition cycles and performing the second number of M2-M1 deposition cycles.

A ratio of the first metal containing oxide layer thickness to the buffer layer thickness may be 200:1 to 1:200, or about 100:1 to 1:100, or about 50:1 to about 1:50. A higher ratio of the rare earth metal containing oxide layer thickness to the buffer layer thickness (e.g., 200:1, 100:1, 50:1, 20:1, 10:1, 5:1, 2:1 etc.) may provide better corrosion and erosion resistance, while a lower ratio of the rare earth metal containing oxide layer thickness to the buffer layer thickness (e.g., 1:2, 1:5, 1:10, 1:20, 1:50, 1:100, 1:200) may provide better heat resistance (e.g., improved resistance to cracking and/or delamination caused by thermal cycling). The thickness ratio may be selected in accordance with specific chamber applications. In an example, for a capacitive coupled plasma environment with high sputter rate, a top layer of 1 μm may be deposited on a 50 nm buffer $Al_2O_3$ layer. For a high temperature chemical or radical environment without energetic ion bombardment, a top layer of 100 nm with a bottom layer of 500 nm may be optimal.

Referring to FIG. 2D, an article 205 may be inserted into an ALD chamber. In this embodiment, the co-deposition process involves co-dosing at least two precursors simultaneously onto the surface of the article. Article 205 may be introduced to a mixture of precursors 210, 220 for a duration until a surface of the article or a body of the article is fully adsorbed with the mixture of precursors 210, 220 to form co-adsorption layer 227. The mixture of two precursors A and B, such as a yttrium-containing precursor and another rare earth metal oxide precursor, are co-injected ($A_xB_y$) at any number of ratios, for example, A90+B10, A70+B30, A50+B50, A30+B70, A10+A90 and so on, into the chamber and adsorbed on the surface of the article. In these examples, x and y are expressed in atomic ratios (mol %) for Ax+By. For example A90+B10 is 90 mol % of A and 10 mol % of B. In some embodiments, at least two precursors are used, in other embodiments at least three precursors are used and in yet further embodiments at least four precursors are used. Subsequently, article 205 having co-adsorption layer 227 may be introduced to a reactant 230 to react with co-adsorption layer 227 to grow a solid rare earth metal containing oxide coating 235. As shown, the co-deposition by co-dosing of the rare earth metal containing coating 235 may be repeated m times to achieve a desired coating thickness, where m is an integer value greater than 1.

ALD processes may be conducted at various temperatures depending on the type of process. The optimal temperature range for a particular ALD process is referred to as the "ALD temperature window." Temperatures below the ALD temperature window may result in poor growth rates and non-ALD type deposition. Temperatures above the ALD temperature window may result in reactions taken place via a chemical vapor deposition (CVD) mechanism. The ALD temperature window may range from about 100° C. to about 650° C. In some embodiments, the ALD temperature window is from about 20° C. to about 200° C., or about 25° C. to about 150° C., or about 100° C. to about 120° C., or about 20° C. to 125° C.

The ALD process allows for a conformal rare earth metal containing oxide coating having uniform thickness on articles and surfaces having complex geometric shapes, holes with high aspect ratios (e.g., pores), and three-dimensional structures. Sufficient exposure time of each precursor to the surface enables the precursor to disperse and fully react with the surface in its entirety, including all of its three-dimensional complex features. The exposure time utilized to obtain conformal ALD in high aspect ratio structures is proportionate to the square of the aspect ratio and can be predicted using modeling techniques. Additionally, the ALD technique is advantageous over other commonly used coating techniques because it allows in-situ on demand material synthesis of a particular composition or formulation without the need for a lengthy and difficult fabrication of source materials (such as powder feedstock and sintered targets.

Another possible ALD deposition technique involves the sequential deposition of multiple different metal oxide layers, followed by interdiffusion between the layers. This may include introducing a first precursor for a first metal, and then introducing a first reactant to form a first metal oxide layer. Subsequently a second metal containing precursor for a second metal may be introduced, followed by the first reactant or a second reactant to form a second metal oxide layer. An annealing operation may then be performed in some embodiments.

In some embodiments, two or more of the above described ALD deposition techniques may be combined to produce a homogenous metal oxide coating. For example, do-deposition and co-dosing may be combined, co-deposition and sequential deposition may be combined, and/or co-dosing and sequential deposition may be combined. In an example, a mixture of a yttrium precursor and an erbium precursor may be injected into an ALD chamber to adsorb yttrium and erbium onto a surface of an article. Subsequently, a mixture of a zirconium precursor and a hafnium precursor may be injected into the ALD chamber to further adsorb zirconium and hafnium onto the surface. Subsequently, an oxygen source reactant may be injected into the ALD chamber to form a $Y_vEr_wZr_xHf_yO_z$ coating.

Figure 3A:
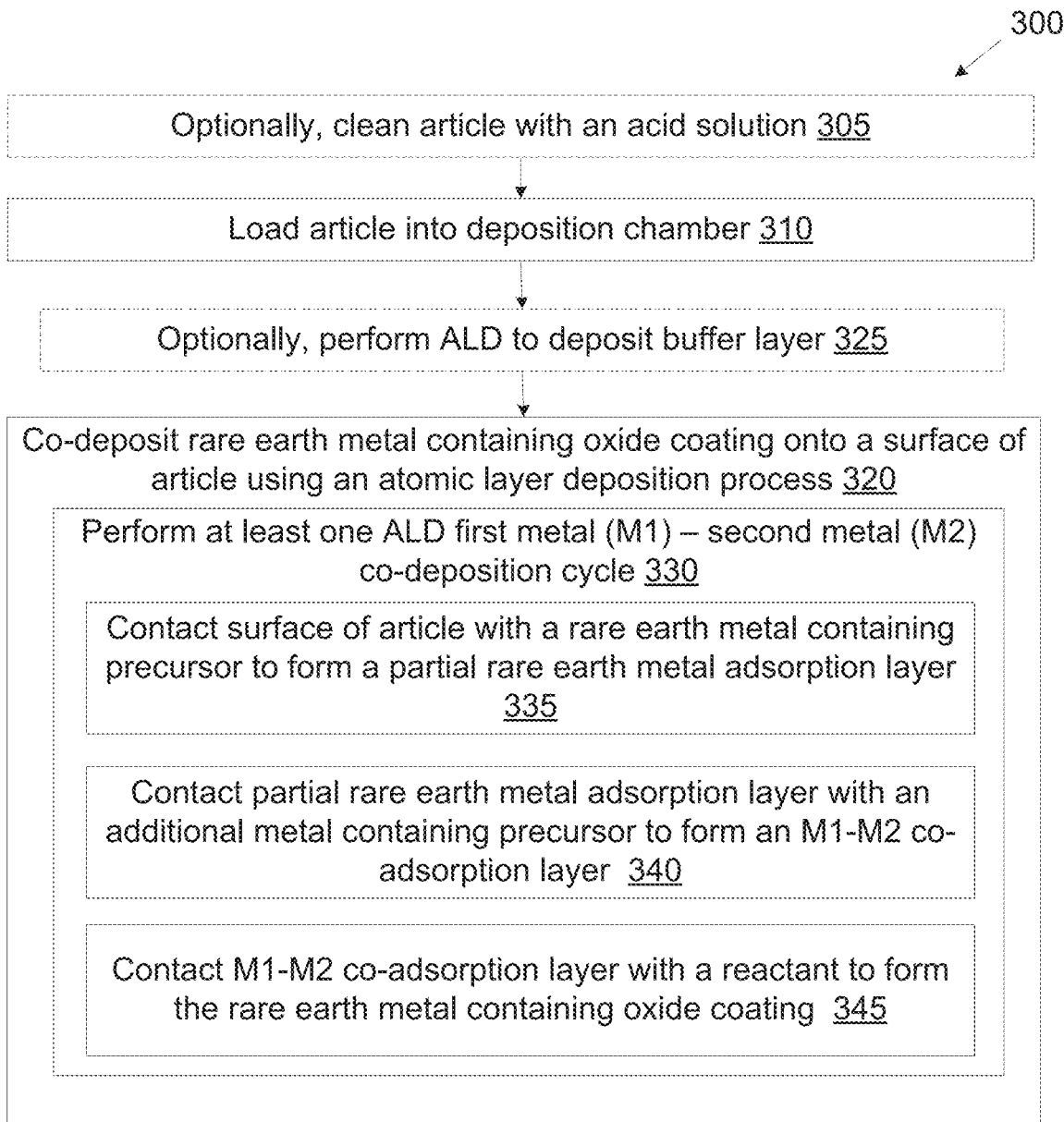
FIG. 3A illustrates a method for forming a rare earth metal containing oxide coating using atomic layer deposition as described herein.

FIG. 3A illustrates a method 300 for forming a rare earth metal containing oxide coating by a co-deposition ALD process. Method 300 may be used to coat any articles described herein. The method 300 may optionally begin by selecting precursors for forming the coating. The composition selection and method of forming may be performed by the same entity or by multiple entities.

The method 300 may optionally include, at block 305, cleaning the article with an acid solution. In one embodiment, the article is bathed in a bath of the acid solution. The acid solution may be a hydrofluoric acid (HF) solution, a hydrochloric acid (HCl) solution, a nitric acid ($HNO_3$) solution, or combination thereof in embodiments. The acid solution may remove surface contaminants from the article and/or may remove an oxide from the surface of the article. Cleaning the article with the acid solution may improve a quality of a coating deposited using ALD. In one embodiment, an acid solution containing approximately 0.1-5.0 vol % HF is used to clean chamber components made of quartz. In one embodiment, an acid solution containing approximately 0.1-20 vol % HCl is used to clean articles made of $Al_2O_3$. In one embodiment, an acid solution containing approximately 5-15 vol % $HNO_3$ is used to clean articles made of aluminum and additional metals.

At block 310, the article is loaded into an ALD deposition chamber. At block 325, the method 300 includes optionally depositing a buffer layer on a surface of the article or a body of the article using ALD. At block 320, ALD is performed to co-deposit a rare earth metal containing oxide coating on the article. At least one M1-M2 co-deposition cycle 330 is performed. The M1-M2 co-deposition cycle includes, at block 335, introducing a first metal containing precursor into the ALD chamber containing the article (with or without the buffer layer). The first metal containing precursor contacts the surface of the article or a body of the article to form a partial metal adsorption layer. At block 340, a second metal containing precursor is introduced into the ALD chamber containing the article having the partial metal adsorption layer. The second metal precursor contacts the remaining exposed surfaces of the article or a body of the article to form a M1-M2 co-adsorption layer. At block 345, a reactant is introduced into the ALD chamber and reacts with the M1-M2 co-adsorption layer to form the rare earth metal containing oxide coating.

Figure 3B:
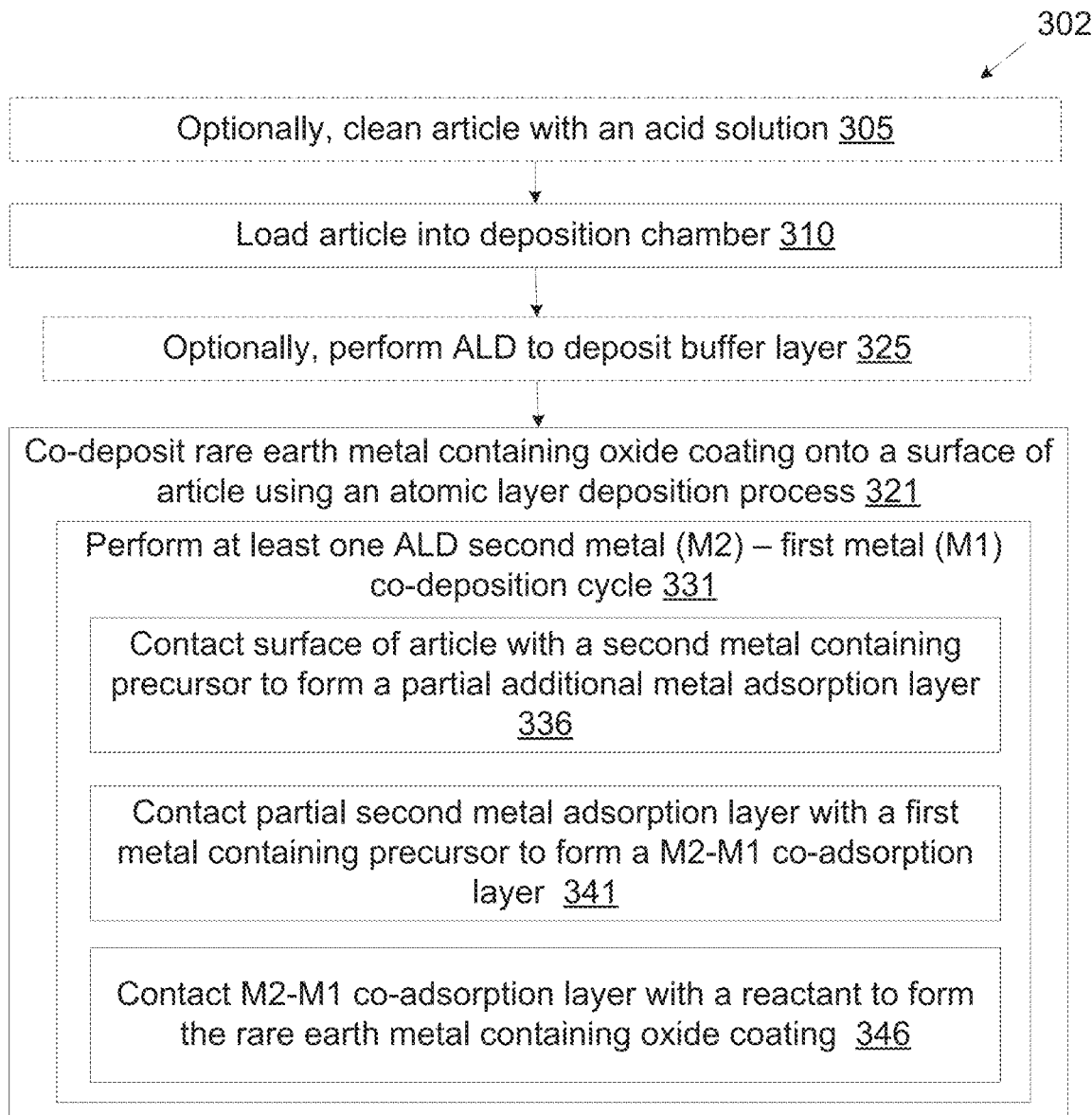
FIG. 3B illustrates a method for forming a rare earth metal containing oxide coating using atomic layer deposition as described herein.

FIG. 3B illustrates a method 302 of forming a rare earth metal containing oxide coating by a co-deposition ALD process. Method 302 may be used to coat any articles described herein. The method 302 may optionally begin by selecting precursors for forming the coating. The composition selection and method of forming may be performed by the same entity or by multiple entities.

The method 302 may optionally include, at block 305, cleaning the article with an acid solution. At block 310, the article is loaded into an ALD deposition chamber. At block 325, the method 302 includes optionally depositing a buffer layer on a surface of the article or a body of the article using ALD. At block 321, ALD is performed to co-deposit a first metal containing oxide coating on the article. At least one M2-M1 co-deposition cycle 331 is performed. The M2-M1 co-deposition cycle includes, at block 336, introducing a second metal containing precursor into the ALD chamber containing the article (with or without the buffer layer). The second metal containing precursor contacts the surface of the article or a body of the article to form a partial metal adsorption layer. At block 341, a first metal containing precursor is introduced into the ALD chamber containing the article having the second metal adsorption layer. The first metal containing precursor contacts the remaining exposed surfaces of the article or a body of the article to form a M2-M1 co-adsorption layer. At block 346, a reactant is introduced into the ALD chamber and reacts with the M2-M1 co-adsorption layer to form the rare earth metal containing oxide coating.

Figure 3C:
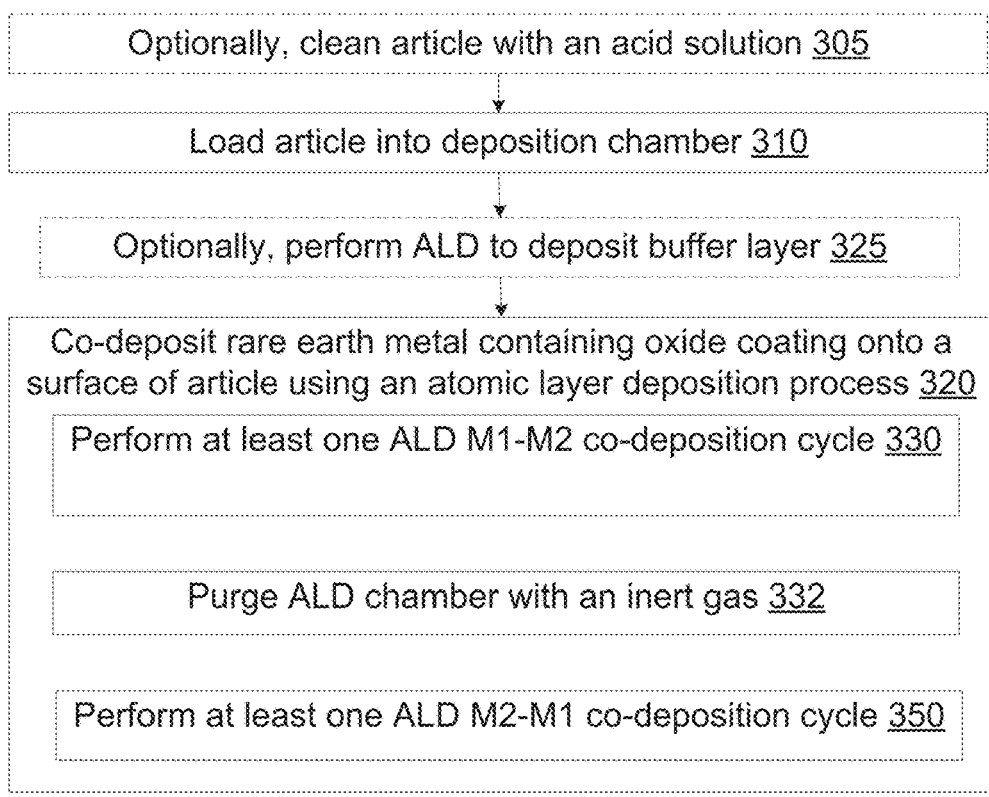
FIG. 3C illustrates a method for forming a rare earth metal containing oxide coating using atomic layer deposition as described herein.

FIG. 3C illustrates a combined method 303 of forming a multilayer coating as described herein which includes performing at least one M1-M2 co-deposition cycle at block 330. Subsequently, the ALD chamber is purged with an inert gas at block 332. At block 350, at least one M2-M1 co-deposition cycle is performed to form the rare earth metal containing oxide coating. As discussed above the co-deposition cycles may be repeated any number of times and in any order to achieve a desired composition of the rare earth metal containing coating. Although not shown, in some embodiments, the deposited coating may be annealed. An annealing temperature of up to about 500° C. may be used for coatings where the second metal is aluminum.

Figure 3D:
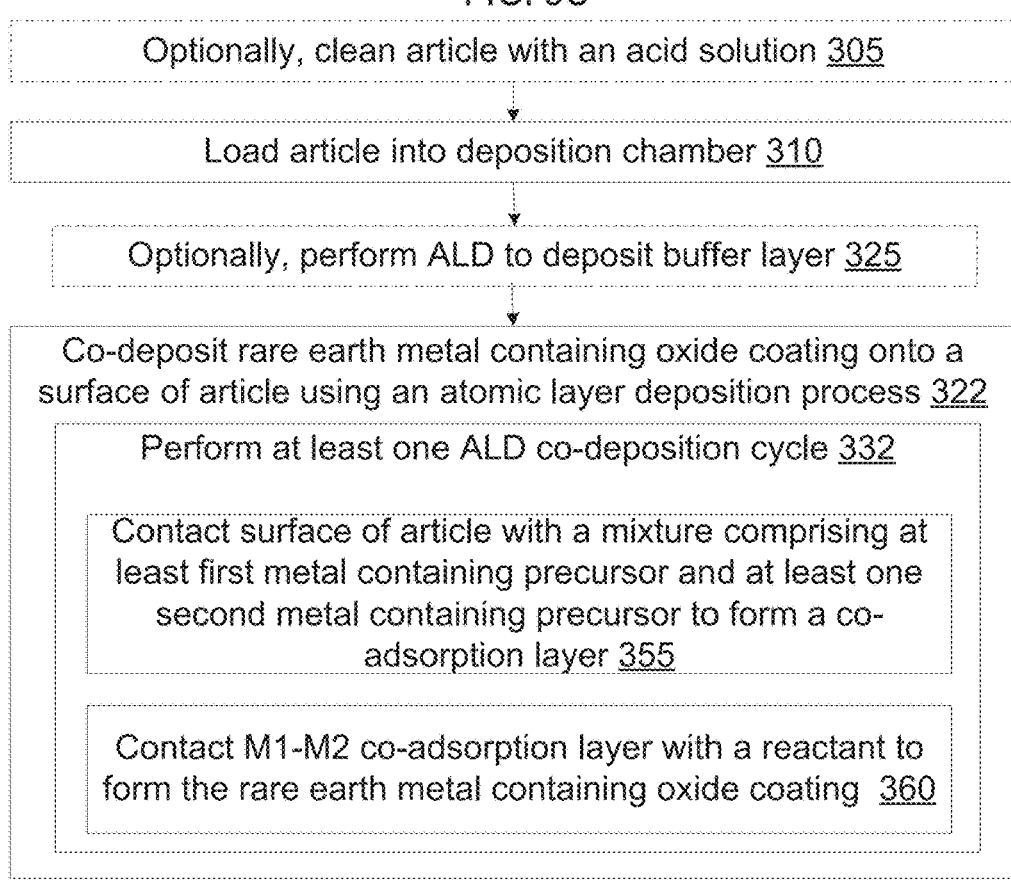
FIG. 3D illustrates a method for forming a rare earth metal containing oxide coating using atomic layer deposition as described herein.

FIG. 3D illustrates a method 304 of co-depositing by co-dosing a rare earth metal containing oxide coating according to embodiments described herein. The method 304 may optionally include, at block 305, cleaning the article with an acid solution. At block 310, the article is loaded into an ALD deposition chamber. At block 325, the method 302 includes optionally depositing a buffer layer on a surface of the article or a body of the article using ALD.

At block 322, ALD is performed to co-deposit by co-dosing a rare earth metal containing oxide coating on the article 205. At least one co-deposition cycle 332 is performed. The co-deposition cycle includes, at block 355, introducing a mixture of a first metal containing precursor and a second metal containing precursor into the ALD chamber containing the article (with or without the buffer layer). The first metal containing precursor and the second metal containing precursor may, independently include a metal selected from a rare earth metal, zirconium, aluminum, hafnium and tantalum. The mixture of precursors contacts the surface of the article or a body of the article to form a co-adsorption layer. At block 360, a reactant is introduced into the ALD chamber and reacts with the co-adsorption layer to form the rare earth metal containing oxide coating. The co-deposition cycle may be repeated as many times as is necessary to achieve a desired thickness of the coating.

According to embodiments, methods can include co-depositing a rare earth metal containing oxide coating on a surface of an article using atomic layer deposition. Co-depositing the rare earth metal containing oxide coating can include contacting the surface with a first metal containing precursor or a second metal containing precursor for a first duration to form a partial metal adsorption layer, wherein the first metal containing precursor or second metal containing precursor is selected from a rare earth metal containing precursor, a zirconium containing precursor, a hafnium containing precursor, a tantalum containing precursor or an aluminum containing precursor; contacting the partial metal adsorption layer with the second metal containing precursor or the first metal containing precursor for a second duration to form a co-adsorption layer comprising the first metal and the second metal; and contacting the co-adsorption layer with a reactant to form the rare earth metal containing oxide coating. In certain embodiments, the rare earth metal containing oxide coating comprises about 1 mol % to about 40 mol % of the first metal and about 1 mol % to about 40 mol % of the second metal, and the rare earth metal containing oxide coating can be a homogenous mixture of the first metal and the second metal.

According to embodiments, co-depositing the rare earth metal containing oxide-coating includes performing at least one M1-M2 co-deposition cycle, including contacting the surface with the first metal containing precursor to form the partial first metal adsorption layer; subsequently contacting the partial first metal adsorption layer with the second metal containing precursor to form a M1-M2 co-adsorption layer; and contacting the M1-M2 co-adsorption layer with the reactant. The at least one M1-M2 co-deposition cycle can result in a layer containing a first percentage of the first metal and a second percentage of the second metal.

In embodiments, co-depositing the rare earth metal containing oxide coating can further include performing at least one M2-M1 co-deposition cycle including contacting the surface with the second metal containing precursor to form a partial second metal adsorption layer; subsequently contacting the additional partial metal adsorption layer with the rare earth metal containing precursor to form a M2-M1 co-adsorption layer; and contacting the M2-M1 co-adsorption layer with the reactant. The at least one M2-M1 co-deposition cycle can result in an additional layer comprising a third percentage of the first metal and a fourth percentage of the second metal, wherein the third percentage is lower than the first percentage and the fourth percentage is greater than the second percentage.

Methods according to embodiments described herein can further include selecting a ratio of a first number of M1-M2 co-deposition cycles and a second number of M2-M1 co-deposition cycles that results in a target first mol % of the first metal and a target second mol % of the second metal; and performing a plurality of deposition super-cycles, wherein each deposition super-cycle comprises performing the first number of M1-M2 co-deposition cycles and performing the second number of M2-M1 deposition cycles. According to embodiments, performing the at least one M1-M2 co-deposition cycle, can include contacting the surface with the rare earth metal containing precursor for about 50 milliseconds to about 60 seconds, or about 1 second to about 60 seconds, or about 5 seconds to about 60 seconds, or about 10 seconds to about 60 seconds; contacting the partial first metal adsorption layer with the second metal containing precursor for about 50 milliseconds to about 60 seconds, or about 1 second to about 60 seconds, or about 5 seconds to about 60 seconds, or about 10 seconds to about 60 seconds; and contacting the M1-M2 co-adsorption layer with the reactant for about 50 milliseconds to about 60 seconds, or about 1 second to about 60 seconds, or about 5 seconds to about 60 seconds, or about 10 seconds to about 60 seconds; and performing the at least one M2-M1 co-deposition cycle. Performing the at least one M2-M1 co-deposition cycle can include contacting the surface with the second metal containing precursor for about 50 milliseconds to about 60 seconds, or about 1 second to about 60 seconds, or about 5 seconds to about 60 seconds, or about 10 seconds to about 60 seconds; contacting the additional partial metal adsorption layer with the rare earth metal containing precursor for about 50 milliseconds to about 60 seconds, or about 1 second to about 60 seconds, or about 5 seconds to about 60 seconds, or about 10 seconds to about 60 seconds; and contacting the M2-M1 co-adsorption layer with the reactant for about 50 milliseconds to about 60 seconds, or about 1 second to about 60 seconds, or about 5 seconds to about 60 seconds, or about 10 seconds to about 60 seconds.

The following examples are set forth to assist in understanding the embodiments described herein and should not be construed as specifically limiting the embodiments described and claimed herein. Such variations, including the substitution of all equivalents now known or later developed, which would be within the purview of those skilled in the art, and changes in formulation or minor changes in experimental design, are to be considered to fall within the scope of the embodiments incorporated herein. These examples may be achieved by performing methods described herein.

EXAMPLE 1

Figure 4C:
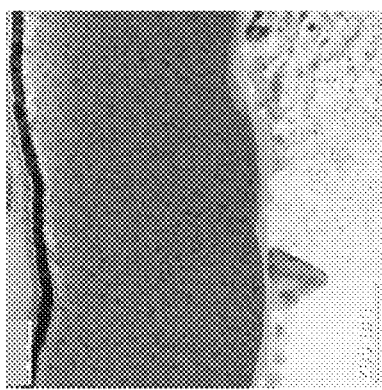
FIG. 4C is a transmission electron microscopy image of a sequentially deposited yttrium zirconium oxide coating after exposure to a nitrogen trifluoride plasma.
Figure 4B:
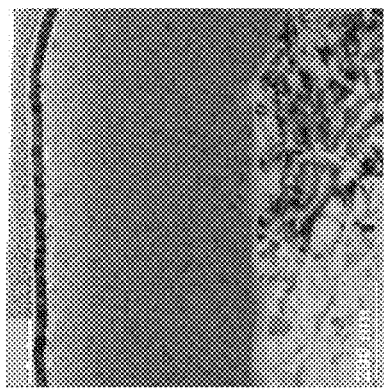
FIG. 4B is a transmission electron microscopy image of a sequentially deposited yttrium aluminum oxide coating on a substrate after exposure to a nitrogen trifluoride plasma.
Figure 4A:
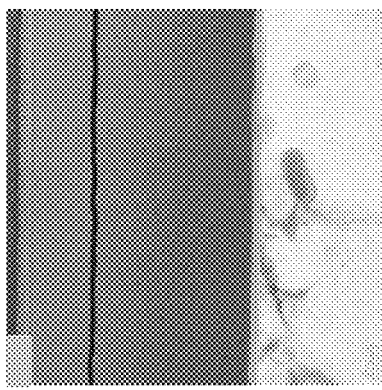
FIG. 4A is a transmission electron microscopy image of a sequentially deposited yttrium aluminum oxide coating prior to exposure to a plasma.

Mechanical Segregation in Coatings Formed by Sequential Deposition of a Rare Earth Metal Oxide and Aluminum Oxide A yttrium-aluminum-oxide ($Y_xAl_yO_z$) coating on a substrate was fabricated using a sequential ALD technique as shown in the transmission electron microscopy image of FIG. 4A. A buffer layer was deposited on the surface of the substrate and then ten (10) cycles of yttrium oxide were deposited on the buffer layer followed by one (1) cycle of aluminum oxide. The coated substrate was loaded into a processing chamber and subjected to a nitrogen trifluoride ($NF_3$) plasma at 450° C. for 3,000 processing cycles. As shown in FIGS. 4B and 4C, which are transmission electron microscopy images of a sequentially deposited yttrium aluminum oxide coating on a substrate after exposure to nitrogen trifluoride plasma, the aluminum oxide layer mechanically segregated from the yttrium oxide layer. The exposure of the coatings to plasma results in layer separation more due to varying amounts of $NF_3$ attack between the YO layer and the AlO layer. Phase segregation also occurs for other sequential deposition processes using different metals and/or different numbers of cycles of first versus second (or further) metals. For example, phase separation has been shown in $Y_xZr_yO_z$ coatings with 5 cycles of $Y_2O_3$ to 1 cycle of $ZrO_2$ (5:1 ratio) and with 5 cycles of $Y_2O_3$ to 2 cycles of $ZrO_2$ (5:2 ratio).

EXAMPLE 2

Co-Deposition of a $Y_xZr_yO_z$ Coating on a Substrate Using ALD

Figure 5A:
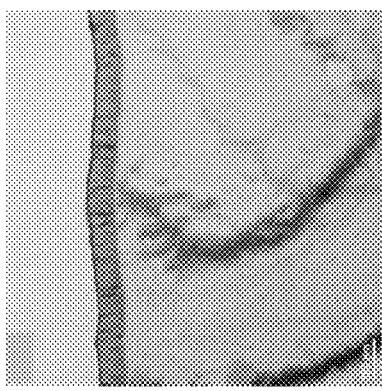
FIG. 5A is a transmission electron microscopy image of a co-deposited yttrium zirconium oxide coating on a substrate.

A yttrium zirconium oxide ($Y_xZr_yO_z$) coating as shown in FIG. 5A was co-deposited onto a substrate using ALD according to embodiments described herein (i.e., M1-M2 and M2-M1 co-deposition cycles were performed). The co-deposition sequence can be represented by the following formula: 180*[2*(1 s Y+1 s Zr+100 ms $H_2O$)+1*(1 s Zr+1 s Y+100 ms $H_2O$)]. Therefore, the coating was formed by a ratio of two (2) RE—Zr co-deposition cycles (m=2) to one (1) Zr—RE co-deposition cycle (n=1). In each of the cycles, each Y and Zr precursor were pulsed for a duration of 1 second. The reactant, $H_2O$, was pulsed for 100 ms. A total of 180 (K=180) super-cycles were performed. The ALD reactor was controlled to a temperature of 300° C. The yttrium containing precursor used to form the film was $(CH_3Cp)_3Y$ and the zirconium containing precursor was Cp tris(dimethylamino) zirconium. The resulting thickness of the rare earth metal containing coating was 50 nm.

The resultant coating was a single layer $Y_xZr_yO_z$ coating having a single phase of a $Y_2O_3$—$ZrO_2$ solid solution. For some compositions, multiple phases may be present, for example, the solid solution, in addition to $Y_2O_3$, yttria-stabilized zirconia (YSZ), $Zr_2Y_2O_7$, $Zr_3Y_4O_{12}$ and/or $ZrO_2$. However, the co-deposition process typically results in a homogenous mixture of the co-deposited metals, here, Y and Zr. Co-deposited coatings, such as the one shown in FIG. 5A, may not suffer from mechanical segregation between layers like the sequentially deposited coating prepared in Example 1. Notably, sequentially deposited coatings may not suffer from mechanical segregation if the cycle ratio between the at least two deposited metals is low enough (e.g., 1:1, 2:1, 3:1) because the layers deposited by ALD are thin enough to thoroughly interdiffuse when subjected to heat. Conversely, if the cycle ratio is, for example, 5 layers of a first metal to two layers of a second metal (i.e., 5:2), then mechanical segregation becomes apparent. As a result, ALD deposition of complex metal oxides by sequential deposition techniques generally result in phase segregation except for a few specific M1:M2 ratios. In particular, phase separation may not occur for sequentially deposited complex metal oxide coatings comprising a 3:1 ratio of the first metal to the second metal (e.g., resulting in 75 mol % O, 20 mol % M1 and 5 mol % M2), complex metal oxide coatings comprising a 2:1 ratio of the first metal to the second metal (e.g., resulting in 70 mol % O, 20 mol % M1 and 10 mol % M2), and complex metal oxide coatings comprising a 1:1 ratio of the first metal to the second metal (e.g., resulting in 65 mol % O, 20 mol % M1 and 15 mol % M2). However, sequential deposition of complex metal oxide coatings having different ratios of M1:M2 may result in some degree of phase segregation.

Figure 5C:
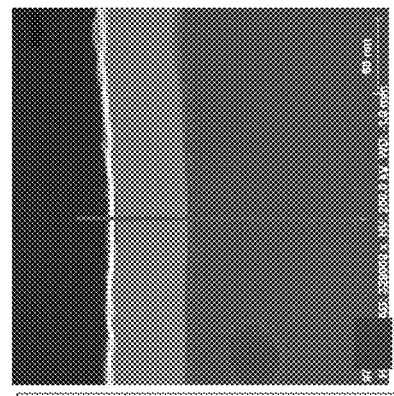
FIG. 5C is the TEM image of the TEM/EDS line scan of the co-deposited coating from FIG. 5A.
Figure 5B:
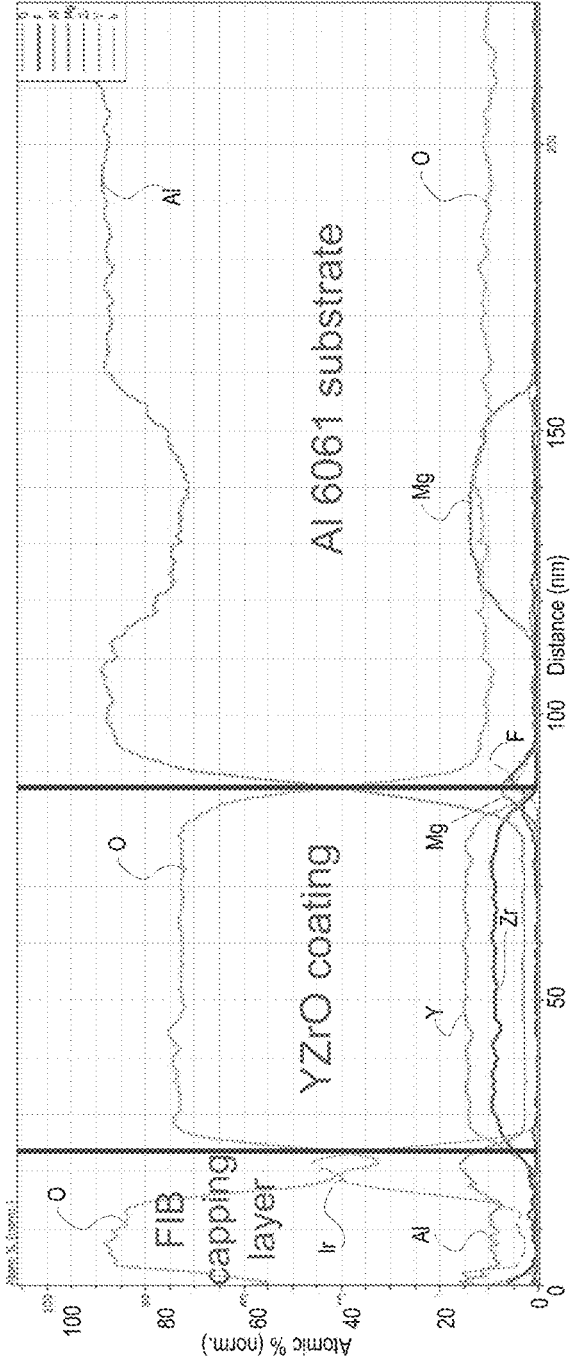
FIG. 5B is the EDS chart of a TEM/EDS line scan of the co-deposited coating from FIG. 5A after exposure to a nitrogen trifluoride plasma.

The co-deposited coating shown in FIG. 5A has a polycrystalline microstructure as determined by electron diffraction. As shown in FIGS. 5B and 5C, a TEM/EDS line scan show that the chemical composition of the coating is homogenous (YZrO) throughout the film depth.

Using Rutherford Backscattering/X-Ray Fluorescence (RBS/XRF) film stoichiometry, it was determined that the atomic concentration of the Y, Zr and O was constant throughout the depth of the film. Table 1 provides the atomic concentrations.

TABLE 1

RBS/XRF Data

| | Atomic Concentrations (at. %) | | | |
|---|---|---|---|---|
| | Si | Y | Zr | O |
| YZrO layer | — | 21.5 | 14.5 | 64 |
| Substrate | 100 | — | — | — |

Secondary Ion Mass Spectroscopy (SIMS) was performed on the co-deposited coating to evaluate whether the coating included any trace elements (e.g., contaminants that diffused from the substrate and into the coating. SIMS is a sensitive measurement technique that can detect metal ion concentrations as low as 1 part per billion (ppb) depending on the element. The SIMS measurements showed that all of the following trace elements were undetectable in the co-deposited coating: Al, B, Ca, Co, Cr, Cu, Fe, Ga, K, Li, Mg, Mn, Na, Ni, Ti. Thus, the SIMS measurement technique did not detect any of these trace elements in the co-deposited coating. The SIMS data shows that the co-deposited coating has a very low surface contamination and successfully prevents diffusion of the trace elements from the underlying aluminum or other substrate into the co-deposited coating even at an elevated temperature of 300° C.

X-Ray Diffraction (XRD) was performed to determine the phases in the film. Table 2 summarizes the results.

TABLE 2

XRD Data

| Phases Identified | Concentration (wt %) | Crystallite size (nm) | % Crystallinity |
|---|---|---|---|
| Zr$_{0.4}$Y$_{0.6}$O$_{1.7}$ Zirconium Yttrium Oxide Cubic | 100% ± 5.0 | 21.3 ± 6.5 | 100% |

EXAMPLE 3

Comparison of YZrO Coatings Prepared by Different Techniques

Several samples were prepared using various ALD deposition schemes. Samples A, B, D and F were prepared by sequential deposition of Y$_2$O$_3$ and ZrO$_2$ at various cycle ratios. The sequentially deposited layers were subsequently annealed to promote interdiffusion between the metals. Sample C was prepared by the same co-deposition scheme as described in Example 2 as follows: 180*[2*(1 s Y+1s Zr+100 ms H$_2$O)+1*(1 s Zr+1s Y+100 ms H$_2$O)]. Sample E was a pure ZrO$_2$ coating deposited by ALD and Samples G and H were pure Y$_2$O$_3$ coatings also deposited by ALD.

As shown in Table 3, Samples A-F containing a combination of Y and Zr or pure ZrO$_2$ had better performance in all categories than the pure Y$_2$O$_3$ coatings of Samples G and H. For example, the pure Y$_2$O$_3$ coatings experienced a microstructure changed layer (e.g., degradation or erosion due to fluorine) of about 20 nm to about 40 nm on their surface as compared to 0 nm for all of the other samples. The depth of fluorination in the pure Y$_2$O$_3$ was at least double (i.e., 100 nm) the depth of fluorination in all of the other samples. The pure Y$_2$O$_3$ samples G and H had higher peak fluorine concentrations than all of the other samples and the total amount of fluorine that diffused into the pure Y$_2$O$_3$ coatings was much higher than in all of the other samples.

Samples A, B and F had no microstructure changed layer on their surface and while the fluorination depth was highest for Sample B having a 2:1 cycle ratio of Y$_2$O$_3$ to ZrO$_2$, Sample B had the lowest peak fluorine concentration of Samples A, B and F and the lowest total amount of fluorine to diffuse into the coating. However, when the ratio of sequential deposition cycles was 5 cycles Y$_2$O$_3$ to 2 cycles ZrO$_2$ as in Sample D, the resultant coating experienced fluorination throughout its entire depth. The peak fluorine concentration in Sample D was 15% and the total amount of fluorine to diffuse into the coating was about 323%*nm. Without being bound by any particular theory, it is believed that at a sequential deposition cycle ratio of 5:2, the coating experienced mechanical (phase) segregation between the Y$_2$O$_3$ and ZrO$_2$ layers, which affected the ability of the metals to interdiffuse and form a solid solution leaving vacancies into which the fluorine could diffuse. It is also believed that as the number of Y$_2$O$_3$ cycles and ZrO$_2$ cycles increases (e.g., 6:3, 7:2, 10:4, etc.) to form a coating having a particular mass ratio of Y to Zr, mechanical segregation between the layers arises. Among YZrO coatings, the total amount of fluorine for Sample 2, the 5:2 YZrO coating deposited by sequential ALD, is much higher than the coatings of Samples A, B and F. Without being bound by any particular theory, it is believed that the differences in total amount of fluorine between samples A, B, D and F may be due to ineffective mixing of the layers, for example, of the relatively thick five (5) cycle layer of Y$_2$O$_3$ and the two (2) cycle layer of ZrO$_2$. The other deposition samples having coatings prepared by the 1:1 (Sample F) and 2:1 (Sample B) sequential deposition schemes are expected to have the best mixing among Samples A, B, D and F due to much thinner layers and efficient inter-diffusion. It is also expected that Sample A having the 3:1 Y$_2$O$_3$ to ZrO$_2$ cycle ratio has a higher peak fluorine concentration and total amount of fluorine than in Sample F (1:1) and Sample B (2:1).

Figure 6A:
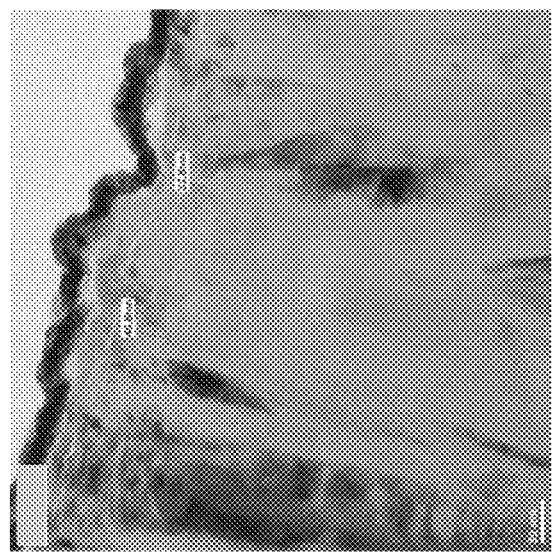
FIG. 6A is a TEM image of a pure yttrium oxide coating after exposure to a fluorine-containing plasma.
Figure 6B:
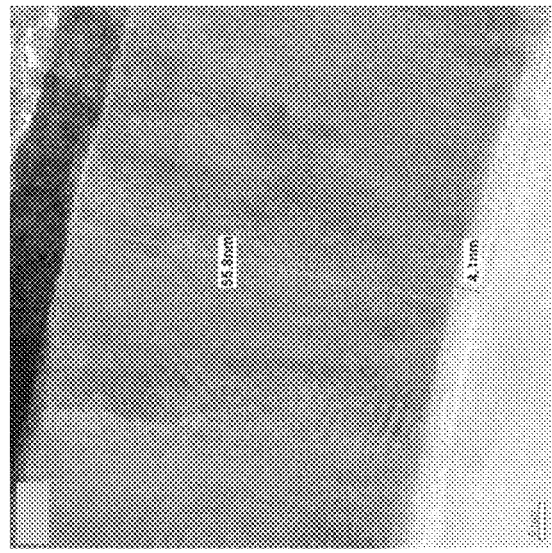
FIG. 6B is a TEM image of a co-deposited yttrium zirconium oxide coating after exposure to a fluorine-containing plasma.
Figure 7A:
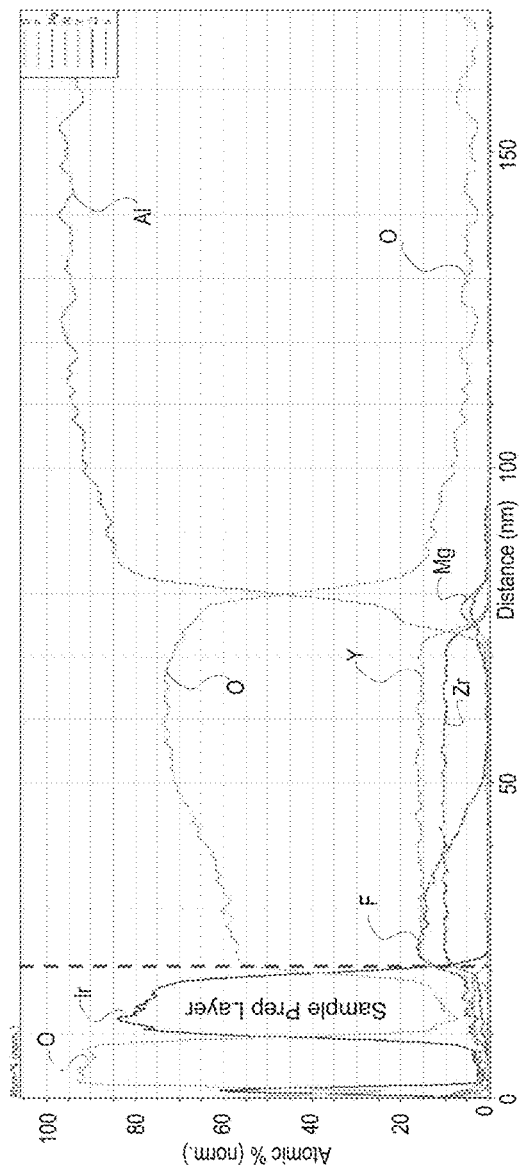
FIG. 7A is the EDS chart of a TEM/EDS line scan of the co-deposited coating.
Figure 7B:
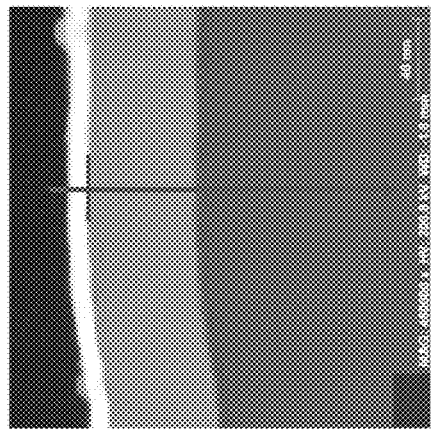
FIG. 7B is the TEM image of the TEM/EDS line scan of the co-deposited coating from FIG. 6A.
Figure 8A:
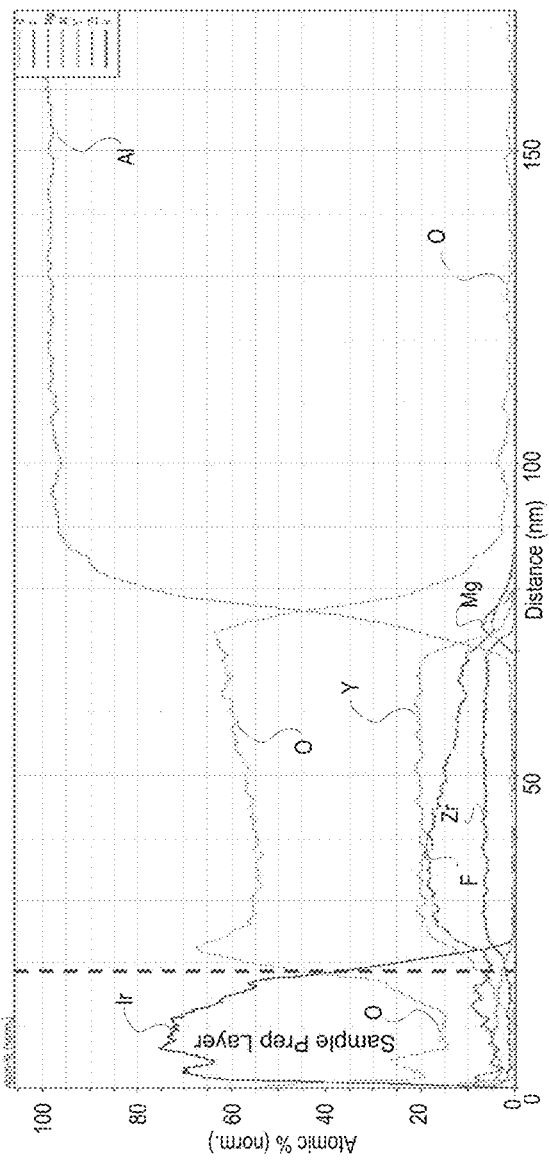
FIG. 8A is the EDS chart of a TEM/EDS line scan of a sequentially deposited coating.
Figure 8B:
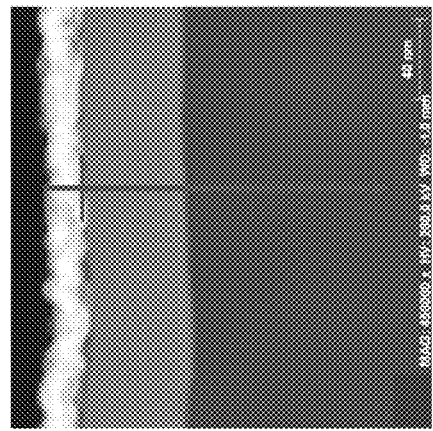
FIG. 8B is the TEM image of the TEM/EDS line scan of the sequentially deposited coating from FIG. 8A.

As discussed previously, co-depositing the Y and Zr metals according to embodiments herein eliminates mechanical segregation between distinct layers containing Y and Zr. FIG. 6A is a TEM image of the pure yttrium oxide coating from Sample G after exposure to a fluorine-containing plasma and FIG. 6B is a TEM image of the co-deposited yttrium zirconium oxide coating from Sample C after exposure to a fluorine-containing plasma. As shown in FIG. 6A, the pure yttrium oxide coating experience microstructure degradation whereas the co-deposited YZrO coating shown in FIG. 6B did not suffer from such degradation.

Without being bound by any particular theory, it is believed that co-depositing the metals results in good mixing (i.e., a homogenous mixture) of the metals and eliminates vacancies within the co-deposited coating thereby forming a solid solution of the metal oxides. The mole ratio of Y to Zr in Sample C (i.e., co-deposition) is comparable to that of Sample D (i.e., 5:2, Y:Zr, Sequential Deposition). However, as shown in Table 3 and the TEM/EDS line scans of FIGS. 7A and 7B and FIGS. 8A and 8B, the co-deposited coating of Sample C permitted fluorination only to a depth of about 30 nm as compared to the entire depth for Sample D. Sample C also had a lower peak fluorine concentration than Sample D and allowed half of the total amount of fluorine to diffuse (i.e., the integral of the fluorine curve on the EDS line scan) into the co-deposited coating as compared to the 5:2 sequentially deposited coating of Sample D.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

TABLE 3

$Y_2O_3$, $ZrO_2$ and YZrO ALD Coating Data Exposure to a Fluorine-containing Plasma

| Coupon | ALD Process | Metals (mol %) | Microstructure changed layer on surface (nm) | Fluorination Depth (nm) | Peak F Concentration (%) | Total Amount of F to Diffuse into Coating (%*nm) |
|---|---|---|---|---|---|---|
| A 50 nm 3:1 YZrO | 3 cycles $Y_2O_3$ 1 cycle of $ZrO_2$ sequential deposition | 75% O 20% Y 5% Zr | 0 | 30 | 15 | 200.417 |
| B 500 nm 2:1 YZrO | 2 cycles $Y_2O_3$ 1 cycle of $ZrO_2$ sequential deposition | 70% O 20% Y 10% Zr | 0 | 50 | 8 | 96.345 |
| C 50 nm codep YZrO | Co-deposition $Y_2O_3$ + $ZrO_2$ | 75% O 15% Y 10% Zr | 0 | 30 | 15 | 323.338 |
| D 50 nm 5:2 YZrO | 5 cycles $Y_2O_3$ 2 cycles $ZrO_2$ sequential deposition | 75% O 19% Y 6% Zr | 0 | 50 (full depth) | 20 | 756.348 |
| E 50 nm ZrO2 | Pure $ZrO_2$ | 75% O 25% Zr | 0 | 0 | 0 | 0 |
| F 50 nm 1:1 YZrO | 1 cycle $Y_2O_3$ 1 cycle $ZrO_2$ sequential deposition | 65% O 20% Y 15% Zr | 0 | 20 | 10 | 101.126 |
| G 1 µm $Y_2O_3$ | Pure $Y_2O_3$ | 65% O 35% Zr | 20-40 | 100 | 35 | 1657.721 |
| H 100 nm $Y_2O_3$ | Pure $Y_2O_3$ | 65% O 35% Zr | 20 | 100 (full depth) | 25 | 1412.336 |

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

What is claimed is:

1. An article comprising:
    a body; and
    a rare earth metal containing oxide coating on a surface of the body,
    wherein the rare earth metal containing oxide coating comprises 10 mol % to about 40 mol % of a first metal, about 5 mol % to about 40 mol % of a second metal, and about 20 mol % to about 85 mol % of oxygen,
    wherein the first metal is a rare earth metal, and the second metal is selected from a group consisting of hafnium and tantalum,
    wherein the rare earth metal containing oxide coating comprises a homogenous mixture of the first metal and the second metal, and
    wherein the article is a component of a processing chamber selected from a group consisting of a chamber wall, a shower head, a nozzle, a plasma generation unit, a radiofrequency electrode, an electrode housing, a diffuser, and a gas line.

2. An article comprising:
a body; and
a rare earth metal containing oxide coating on a surface of the body,
wherein the rare earth metal containing oxide coating comprises 10 mol % to about 40 mol % of a first metal, about 5 mol % to about 40 mol % of a second metal, and about 20 mol % to about 85 mol % of oxygen, wherein the first metal is a rare earth metal, and the second metal is selected from a group consisting of hafnium and tantalum,
wherein the rare earth metal containing oxide coating comprises a homogenous mixture of the first metal and the second metal, and
wherein the rare earth metal containing oxide coating has a thickness of about 5 nm to about 10 μm.

3. An article comprising:
a body; and
a rare earth metal containing oxide coating on a surface of the body,
wherein the rare earth metal containing oxide coating comprises 10 mol % to about 40 mol % of a first metal, about 5 mol % to about 40 mol % of a second metal, and about 20 mol % to about 85 mol % of oxygen, wherein the first metal is a rare earth metal, and the second metal is selected from a group consisting of hafnium and tantalum,
wherein the rare earth metal containing oxide coating comprises a homogenous mixture of the first metal and the second metal, and
wherein the body comprises a material selected from a group consisting of aluminum, steel, silicon, copper and magnesium.

4. The article of claim 1, wherein the first metal comprises a rare earth metal selected from a group consisting of yttrium, erbium, lanthanum, lutetium, scandium, gadolinium, samarium and dysprosium.

5. An article comprising:
a body; and
a rare earth metal containing oxide coating on a surface of the body,
wherein the rare earth metal containing oxide coating comprises 10 mol % to about 40 mol % of a first metal, about 5 mol % to about 40 mol % of a second metal, and about 20 mol % to about 85 mol % of oxygen, wherein the first metal is a rare earth metal, and the second metal is selected from a group consisting of hafnium and tantalum,
wherein the rare earth metal containing oxide coating comprises a homogenous mixture of the first metal and the second metal,
wherein the first metal comprises yttrium, and
wherein the rare earth metal containing oxide coating further comprises zirconium at a concentration of about 1 mol % to about 40 mol %.

6. The article of claim 1, wherein the rare earth metal containing oxide coating comprises a composition selected from a group consisting of $Y_wZr_xHf_yO_z$, $Er_wZr_xHf_yO_z$, $Y_vEr_wZr_xHf_yO_z$, $Y_xHf_yO_z$, $Er_xHf_yO_z$, $Y_xTa_yO_z$, $Er_xTa_yO_z$, $Y_wTa_xHf_yO_z$, $Er_wTa_xHf_yO_z$ and $Y_vEr_wTa_xHf_yO_z$, wherein v, w, x, y, and z are integers or decimal values.

7. An article comprising:
a body; and
a rare earth metal containing oxide coating on a surface of the body, and
a buffer layer on the surface of the body,
wherein the rare earth metal containing oxide coating comprises 10 mol % to about 40 mol % of a first metal, about 5 mol % to about 40 mol % of a second metal, and about 20 mol % to about 85 mol % of oxygen, wherein the first metal is a rare earth metal, and the second metal is selected from a group consisting of hafnium and tantalum,
wherein the rare earth metal containing oxide coating comprises a homogenous mixture of the first metal and the second metal,
wherein the rare earth metal containing oxide coating covers the buffer layer, and
wherein the buffer layer comprises a material selected from a group consisting of an aluminum oxide, a silicon oxide and aluminum nitride.

* * * * *